(12) United States Patent
Sekiguchi et al.

(10) Patent No.: US 8,198,162 B2
(45) Date of Patent: Jun. 12, 2012

(54) SEMICONDUCTOR DEVICE AND A METHOD OF MANUFACTURING THE SAME

(75) Inventors: Kazuya Sekiguchi, Tokyo (JP); Yoshio Fukayama, Tokyo (JP); Yuji Takahashi, Tokyo (JP); Tomokuni Chino, Tokyo (JP); Tsuyoshi Kachi, Tokyo (JP); Katsuhiro Mitsui, Tokyo (JP); Daisuke Ono, Tokyo (JP); Tatsuhiko Miura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 536 days.

(21) Appl. No.: 12/351,266

(22) Filed: Jan. 9, 2009

(65) Prior Publication Data
US 2009/0179261 A1 Jul. 16, 2009

(30) Foreign Application Priority Data

Jan. 10, 2008 (JP) ................................. 2008-002993

(51) Int. Cl.
*H01L 21/336* (2006.01)
(52) U.S. Cl. ........ 438/270; 438/259; 257/330; 257/341; 257/E29.027
(58) Field of Classification Search .................. 257/330, 257/341, 342, E29.027, E29.066, E21.384; 438/137, 138, 259, 270
See application file for complete search history.

(56) References Cited

U.S. PATENT DOCUMENTS

| 6,245,653 B1 * | 6/2001 | Beyer et al. ................. 438/597 |
| 6,746,950 B2 * | 6/2004 | Shan ............................ 438/618 |
| 6,984,864 B2 * | 1/2006 | Uno et al. .................... 257/382 |
| 7,378,002 B2 * | 5/2008 | Lee et al. .................. 204/192.17 |
| 7,405,149 B1 * | 7/2008 | Lin et al. ...................... 438/622 |
| 7,679,104 B2 * | 3/2010 | Sato et al. .................... 257/190 |
| 2008/0035989 A1 * | 2/2008 | Jaw et al. ..................... 257/330 |

FOREIGN PATENT DOCUMENTS

| JP | 6-163453 A | 6/1994 |
| JP | 11-8304 A | 1/1999 |
| JP | 11-297823 A | 10/1999 |
| JP | 11-297824 A | 10/1999 |

* cited by examiner

*Primary Examiner* — David Vu
(74) *Attorney, Agent, or Firm* — Miles & Stockbridge P.C.

(57) ABSTRACT

Provided is a manufacturing method of a semiconductor device wherein the generation of voids is prevented in aluminum-based electrodes or the like. The method is suitable for manufacturing a semiconductor device adapted for vehicles, which is required to have a high reliability. However, it is very difficult that power semiconductor devices such as power MOSFETs, in particular, trench gate type power MOS devices are formed without having any void since the thickness of aluminum-based electrodes thereof is as large as about 3500 to 5500 nm (2.5 μm or more). In the present invention, a method is provided wherein at the time of forming an aluminum-based electrode metal film positioned over a wafer and having a thickness of 2.5 μm or more over a highland/lowland-repeated region in a line and space form by sputtering, the temperature of the wafer is set to 400° C. or higher and lower than 500° C.

19 Claims, 24 Drawing Sheets

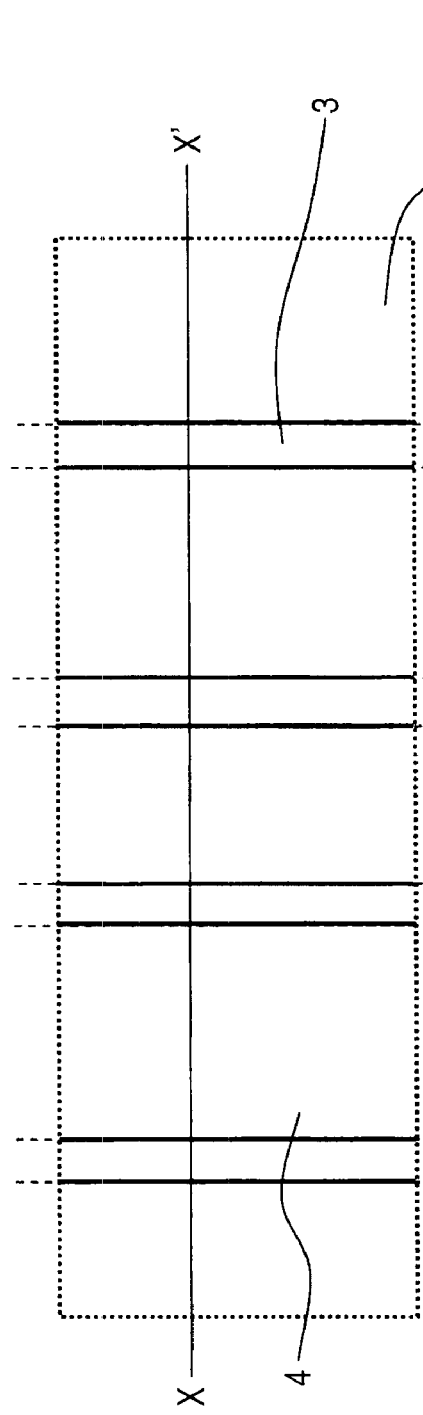
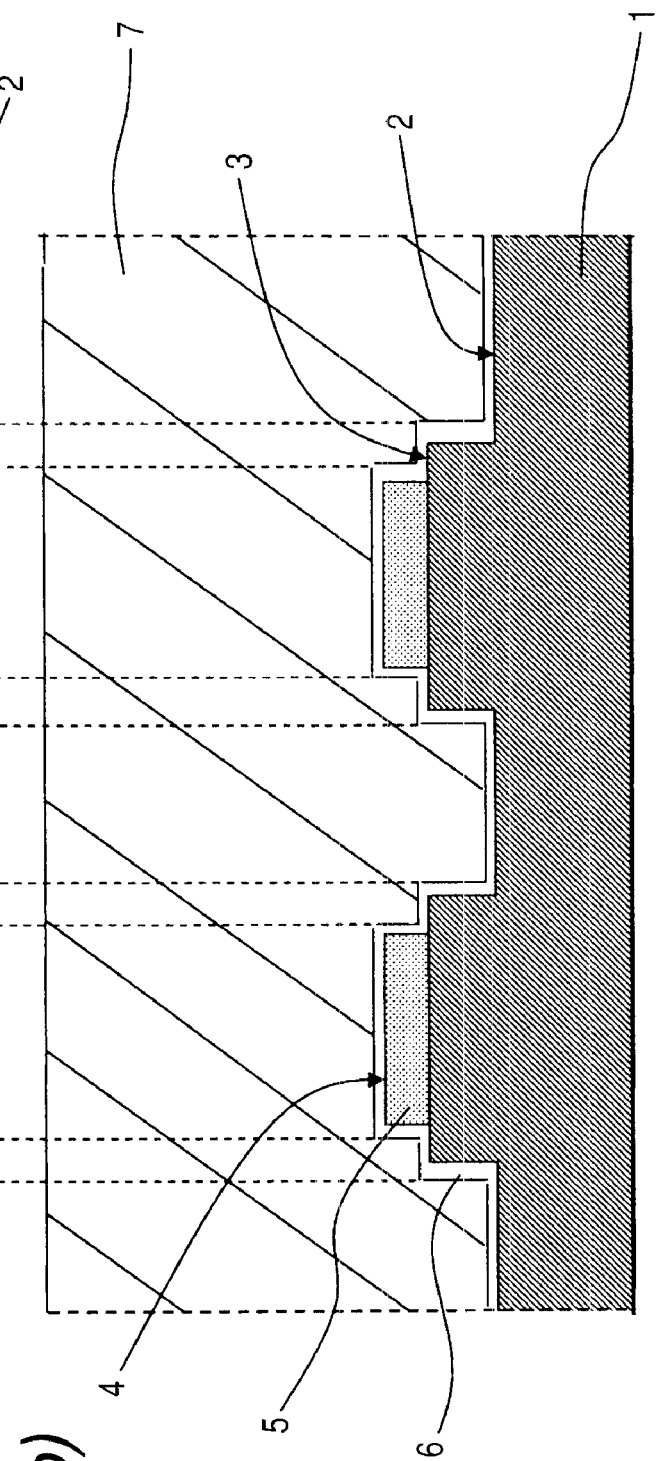
FIG. 1(a)
FIG. 1(b)

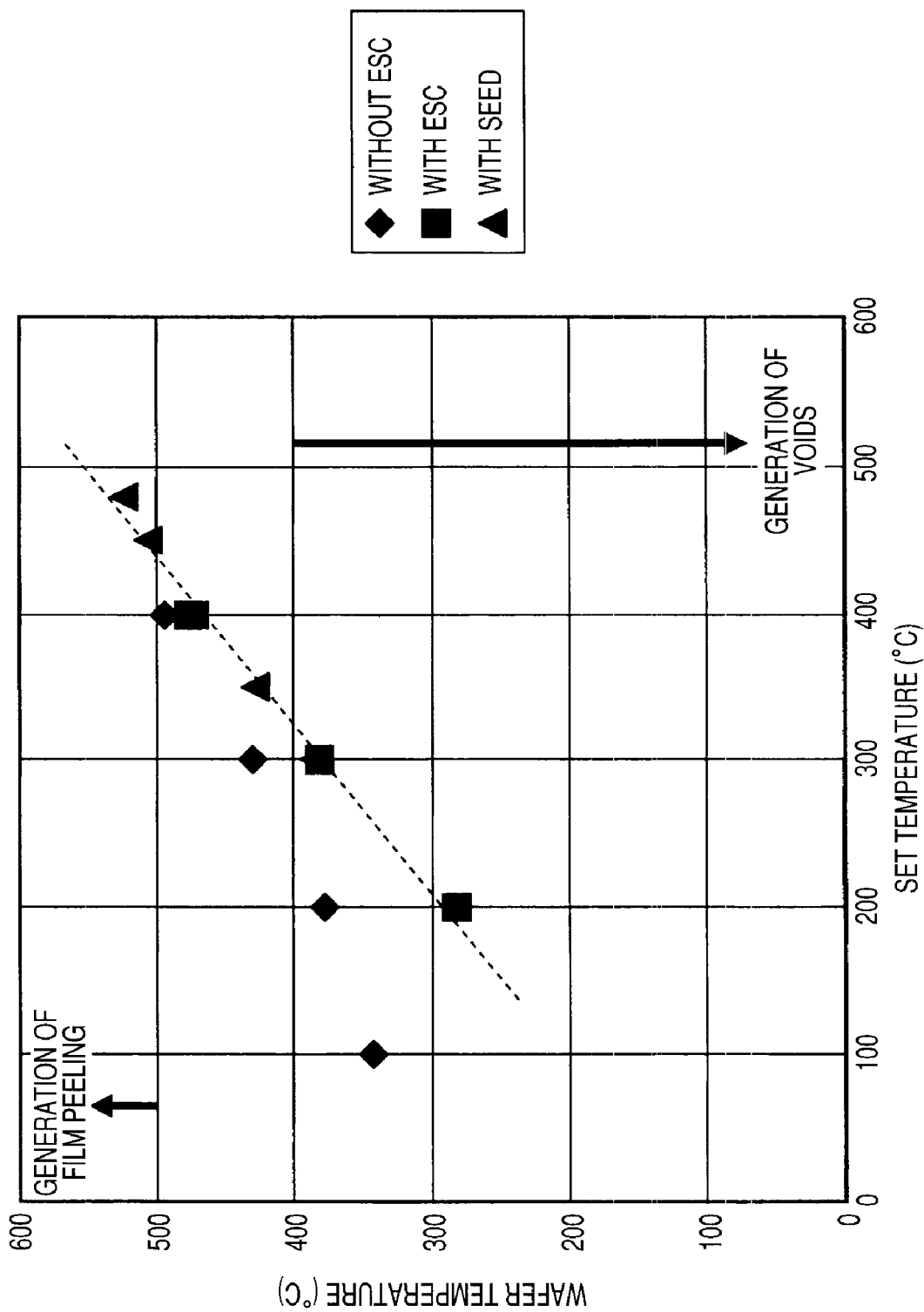

SEMICONDUCTOR DEVICE AND A METHOD OF MANUFACTURING THE SAME

CROSS-REFERENCE TO RELATED APPLICATIONS

The disclosure of Japanese Patent Application No. 2008-2993 filed on Jan. 10, 2008 including the specification, drawings and abstract is incorporated herein by reference in its entirety.

BACKGROUND OF THE INVENTION

The present invention relates to a technique which is effectively applied to aluminum-film-forming technique in a method of manufacturing a semiconductor device (or a semiconductor integrated circuit device).

Japanese Unexamined Patent Publication (JP-A) No. Hei 6-163453 (Patent Document 1) discloses a technique of tapering an underlying layer by SOG in order to prevent aluminum distribution lines from snapping in contact regions.

Japanese Unexamined Patent Publication No. Hei 11-297823 (Patent Document 2) and Japanese Unexamined Patent Publication No. Hei 11-297824 (Patent Document 3) each disclose a technique of forming a TiSi wetting layer and then depositing aluminum thereon at a temperature ranging from 350 to 500° C. by sputtering in order to prevent the generation of voids in aluminum distribution lines or the snapping of the lines in contact regions.

Japanese Unexamined Patent Publication No. Hei 11-8304 (Patent Document 4) discloses a technique of depositing a titanium wetting layer and an aluminum layer successively by sputtering and then subjecting the resultant to thermal treatment at a temperature ranging from 400 to 500° C. in order to prevent the generation of voids in aluminum distribution lines in fine hole regions.

Patent Document 1: Japanese Unexamined Patent Publication No. Hei 6(1994)-163453
Patent Document 2: Japanese Unexamined Patent Publication No. Hei 11(1999)-297823
Patent Document 3: Japanese Unexamined Patent Publication No. Hei 11(1999)-297824
Patent Document 4: Japanese Unexamined Patent Publication No. Hei 11(1999)-8304

SUMMARY OF THE INVENTION

Semiconductor devices adapting for vehicles are required to have a high reliability in light of the peculiarity of the usage thereof. It is therefore necessary in principle to form aluminum-based electrodes and others without having any void. However, according to conventional thoughts, it is very difficult that power semiconductor devices such as power MOSFETs, in particular, trench gate type power MOS devices are formed without having any void since the thickness of aluminum-based electrodes thereof is as large as about 3500 to 5500 nm (2.5 µm or more). This is based on the following: it is necessary to embed an electrode metal film uniformly in a relatively broad region (source electrode region) where a great number of highlands and lowlands that are each in the form of a band very long in the longitudinal direction thereof are alternately and repeatedly arranged in a line and space form, which is different from a case where the area of lowlands is very small as in contact regions of ordinary integrated circuits.

The present invention has been made to solve such problems.

An object of the invention is to provide a method of manufacturing a semiconductor device having a high reliability.

The object of the invention and other objects thereof, and novel features thereof will be made evident from the description of the present specification, and drawings attached thereto.

Typical one out of aspects of the invention disclosed in the present application is briefly described as follows:

The typical aspect of the invention is a method of manufacturing a semiconductor, wherein the temperature of a wafer is set to 400° C. or higher and less than 500° C. when an aluminum-based electrode metal film having a thickness of 2.5 µm or more is formed over a highland/lowland-repeated region in a line and space form by sputtering.

Advantageous effects of the typical aspect of the invention are briefly described as follows:

By setting the temperature of a wafer to 400° C. or higher and less than 500° C. when an aluminum-based electrode metal film having a thickness of 2.5 µm or more is formed over a highland/lowland-repeated region in a line and space form by sputtering, the generation of voids can be prohibited in the aluminum-based electrode metal film.

BRIEF DESCRIPTION OF THE DRAWINGS

FIGS. 1(a) and 1(b) are views illustrating a semiconductor device manufactured by a semiconductor-device-manufacturing method of an embodiment of the invention, the former of which is a top view of a main portion of the device, and the latter of which is an X-X' sectional view of FIG. 1(a).

FIG. 4 is a comparing-data plotted chart wherein changes in aluminum-electrode sputtering-property when detailed conditions for the semiconductor-device-manufacturing method of the embodiment of the invention are variously changed are plotted on a graph showing a relationship between the set temperature of a wafer stage and the temperature of the upper surface of a wafer measured with a radiation thermometer.

DETAILED DESCRIPTION OF THE INVENTION

Summary of Embodiments

Figure 2:
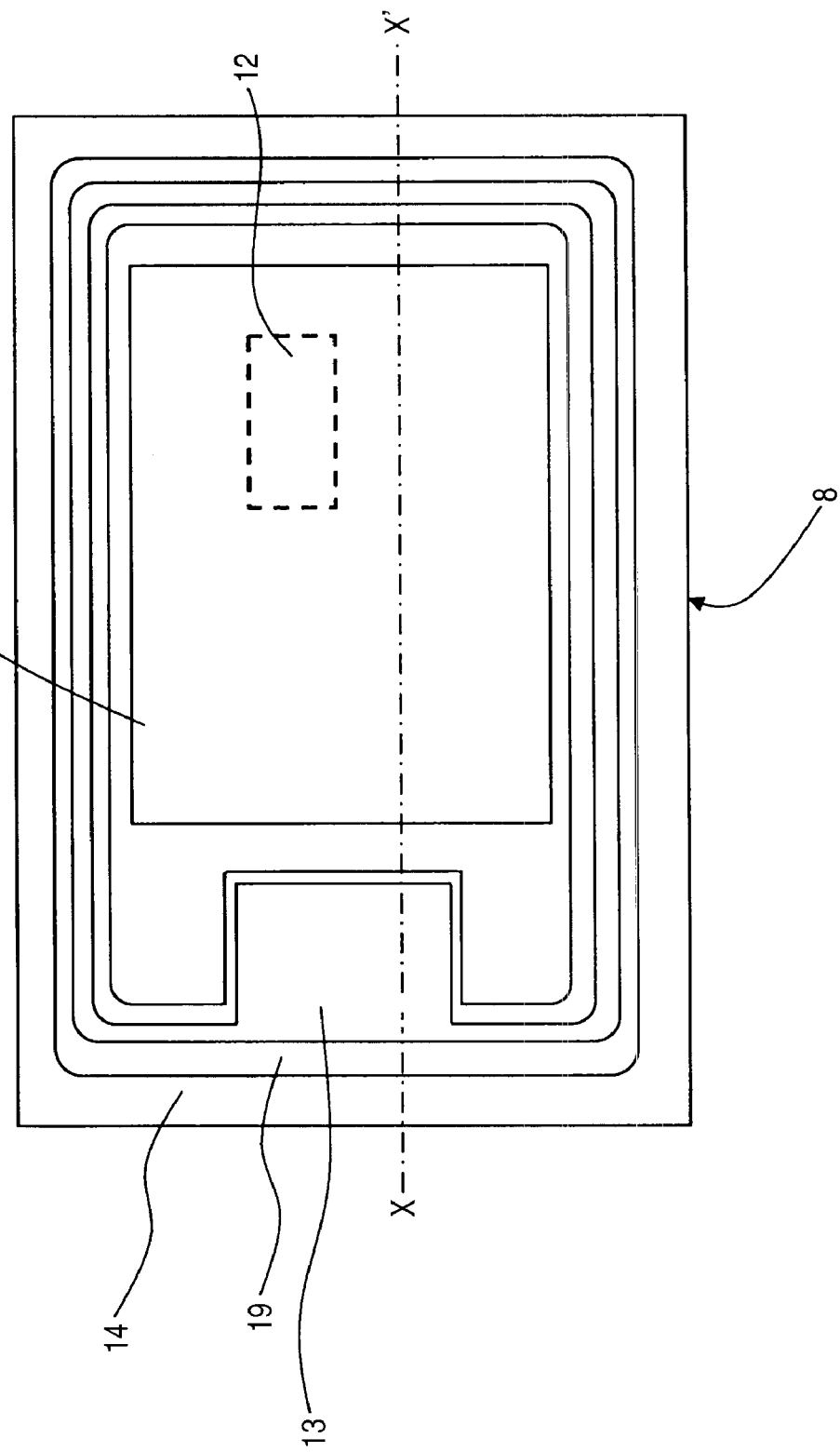
FIG. 2 is a top view of the whole of this semiconductor device.

First, typical embodiments of the invention disclosed in the application are described below.

1. A method of manufacturing a semiconductor device, comprising the steps of: (a) forming a barrier metal film over a first main surface of a wafer having a band-form repeated device pattern region containing an insulated region and an electro-conductive region; (b) forming an electrode metal film comprising aluminum as a principal component and having a film thickness of 2.5 μm or more over the barrier metal film by sputtering under a condition that the temperature of the wafer is 400° C. or higher and lower than 500° C.; (c) forming a resist film pattern over the electrode metal film; and (d) patterning the electrode metal film by wet etching in the state that the resist film pattern is present over the electrode metal film.

2. The method of manufacturing a semiconductor device according to item 1, further comprising a step of: (e) patterning the barrier metal film by dry etching in the state that the patterned electrode metal film is present over the barrier metal film.

3. The method of manufacturing a semiconductor device according to item 1 or 2, further comprising a step of: (f) after the step (a) and before the step (b), forming an underlying metal film comprising aluminum as a principal component and having a film thickness of less than 0.5 μm over the barrier metal film by sputtering under a condition that the temperature of the wafer is lower than 400° C.

4. The method of manufacturing a semiconductor device according to any one of items 1 to 3, wherein the device pattern region comprises: (x) a plurality of band-form highland regions extending in substantially parallel to each other; and (y) a band-form valley region in each of spaces between the band-form highland regions.

5. The method of manufacturing a semiconductor device according to item 4, further comprising a step of: (g) forming tapered portions at both ends of each of the band-form highland regions before the step (a), the both ends facing some of the band-form valley regions.

6. The method of manufacturing a semiconductor device according to item 5, wherein the formation of the tapered portions is attained by dry etching in the atmosphere of a gas comprising argon gas as a principal component.

7. The method of manufacturing a semiconductor device according to any one of items 1 to 6, wherein the step (b) comprises the substeps of: (b1) forming a first electrode metal film which is a portion of the electrode metal film and comprises aluminum as a principal component over the barrier metal film by sputtering in which a first electric power is applied under the condition that the temperature of the wafer is 400° C. or higher and lower than 500° C.; and (b2) after the substep (b1), forming a second electrode metal film which is a portion of the electrode metal film and comprises aluminum as a principal component over the first electrode metal film by sputtering in which a second electric power lower than the first electric power is applied under the condition that the temperature of the wafer is 400° C. or higher and lower than 500° C.

8. The method of manufacturing a semiconductor device according to item 7, wherein the substeps (b1) and (b2) are carried out in the state that the wafer is put over an electrostatic chuck which is in an operating state.

9. The method of manufacturing a semiconductor device according to any one of items 3 to 8, wherein the step (f) is carried out in the state that the wafer is put over the electrostatic chuck which is in a non-operating state or over a wafer susceptor which is not any electrostatic chuck.

10. The method of manufacturing a semiconductor device according to any one of items 7 to 9, wherein the step (f), and the substeps (b1) and (b2) are carried out in the same sputtering chamber.

11. The method of manufacturing a semiconductor device according to any one of items 7 to 10, wherein the substeps (b1) and (b2) are carried out in the same sputtering chamber.

12. The method of manufacturing a semiconductor device according to any one of items 1 to 11, wherein the steps (a) and (b) are carried out in the same machine.

13. The method of manufacturing a semiconductor device according to any one of items 1 to 12, wherein the wet etching in the step (d) is performed, using an etchant comprising phosphoric acid and nitric acid as principal components.

14. The method of manufacturing a semiconductor device according to any one of items 1 to 13, wherein the semiconductor device is a power MOSFET device.

15. The method of manufacturing a semiconductor device according to any one of items 1 to 13, wherein the semiconductor device is a power MOSFET device of a trench gate type.

16. The method of manufacturing a semiconductor device according to any one of items 1 to 15, wherein the electrode metal film is an aluminum-based metal film comprising silicon in an amount of less than several percent and comprising aluminum as a principal component.

17. The method of manufacturing a semiconductor device according to any one of items 1 to 16, wherein the barrier metal film comprises titanium and tungsten as principal components.

18. The method of manufacturing a semiconductor device according to any one of items 7 to 17, wherein the step (f) and the substeps (b1) and (b2) are carried out, using sputtering targets having substantially the same composition.

19. The method of manufacturing a semiconductor device according to any one of items 7 to 18, wherein the second electrode metal film is thicker than the first electrode metal film.

20. A trench gate power MOS semiconductor device comprising: (a) a silicon-based semiconductor substrate having a first main surface; (b) a plurality of columnar trench gate electrodes embedded in the first main surface of the silicon-based semiconductor substrate and extending in substantially parallel to each other along the first main surface; (c) band-form highland regions formed along the individual columnar trench gate electrodes and over the first main surface over the electrodes, wherein a surface region of each of the highland regions comprises an insulating film; (d) a band-form valley region arranged in a space between any adjacent regions out of the band-form highland regions and comprising a semiconductor region which is a portion of the semiconductor substrate; (e) a barrier metal film formed to cover the band-form highland regions and the band-form valley regions; and (f) an electrode metal film formed to cover the barrier metal film, comprising aluminum as a principal component and having a film thickness of 2.5 μm or more, wherein tapered portions are formed at both ends of each of the band-form highland regions, the both ends facing some of the band-form valley regions.

21. A method of manufacturing a semiconductor device, comprising the steps of: (a) forming a barrier metal film over a first main surface of a wafer having a repeated device pattern region containing an insulated region and an electroconductive region; (b) forming an electrode metal film comprising aluminum as a principal component and having a film thickness of 2.5 μm or more over the barrier metal film by sputtering under a condition that the temperature of the wafer is 400° C. or higher and lower than 500° C.; (c) forming a resist film pattern over the electrode metal film; and (d) patterning the electrode metal film by wet etching in the state that the resist film pattern is present over the electrode metal film.

22. The method of manufacturing a semiconductor device according to item 21, further comprising a step of: (e) patterning the barrier metal film by dry etching in the state that the patterned electrode metal film is present over the barrier metal film.

23. The method of manufacturing a semiconductor device according to item 21 or 22, further comprising a step of: (f) after the step (a) and before the step (b), forming an underlying metal film comprising aluminum as a principal component and having a film thickness of less than 0.5 μm over the barrier metal film by sputtering under a condition that the temperature of the wafer is lower than 400° C.

24. The method of manufacturing a semiconductor device according to any one of items 21 to 23, wherein the step (b) comprises the substeps: (b1) forming a first electrode metal film which is a portion of the electrode metal film and comprises aluminum as a principal component over the barrier metal film by sputtering in which a first electric power is applied under the condition that the temperature of the wafer is 400° C. or higher and lower than 500° C.; and (b2) after the substep (b1), forming a second electrode metal film which is a portion of the electrode metal film and comprises aluminum as a principal component over the first electrode metal film by sputtering in which a second electric power lower than the first electric power is applied under the condition that the temperature of the wafer is 400° C. or higher and lower than 500° C.

[Explanation of the Description Manner, Basic Terms, and Format in the Present Application]

1. In the embodiments, a description may be made after divided in plural sections if necessary for convenience's sake. These plural sections are not independent each other, but they may each be a part of a single example or one of them may be partial details of the other or a modification example of a part or whole of the other unless otherwise specifically indicated. In principle, description is not repeated with regards to similar portions. In the embodiments, when a reference is made to constituent elements, they are not essential unless otherwise specifically indicated, limited to the number theoretically, or principally apparent from the context that it is not.

2. In connection with any material, any composition or the like in the description of embodiments and others, in the case of using the wording "X comprising A, or X made of A" or the like, a matter that an element other than A is contained as one out of principal constituting elements is excluded except any case where it is evidently stated that this matter is improper, and any case where this matter is clearly interpreted to be improper from the context in the same manner as described above. For example, the wording "X comprising A, or X made of A" has a meaning that "X contains A as a principal component", or some other meaning. It is needless to say that, for example, the wording "silicon member" is not limited to a member consisting of pure silicon, and includes, in the category thereof, a member containing SiGe alloy or some other multi-component alloy containing silicon as a principal component, and a member containing not only Si but also other additives. In the same manner, it is needless to say that the wording "silicon oxide film" includes, in the category thereof, an undoped silicon dioxide film, which is relatively pure, an FSG (fluorosilicate glass) film, a TEOS-based silicon oxide film, a SiOC (silicon oxycarbide) film, a carbon-doped silicon oxide film, thermal oxide films such as ODG (organosilicate glass), PSG (phosphorous silicate glass) and BPSG (borophosphosilicate glass) films, a CVD oxide film, applied silicon oxide films such as SOG (spin on glass) and NSC (nano-clustering silica) films, a silica-based low-k insulating film (porous insulating film), wherein pores are incorporated into any one of the same films as described above, and a composite film wherein any one of the above-mentioned films, as a principle element, is combined with a different silicon-based insulating film.

In an aluminum-containing member such as such as an "aluminum film", an "aluminum pad", or an "aluminum electrode", in general, the aluminum therein is not pure aluminum but is actually an aluminum based alloy containing, as a principal component, aluminum, such as AlSi (Al: 99% and Si: 1%, which may contain a very small amount of an additive or impurity, the same matter being correspondingly applied to the following), or AlCuSi (containing copper and silicon in an amount of several percent or less, and Al as the balance). In general, the composition of the aluminum-containing member is aluminum plus additives, the amount of the additives being about several percent.

3. In the same manner, about forms or shapes, positions, attributes, and others, preferred examples thereof will be described or illustrated by sentences or figures. However, it is needless to say that the form, shape and the others of any article, component or portion described or illustrated are not strictly limited to the preferred examples except any case where it is evidently stated that this matter is improper, and any case where this matter is clearly interpreted to be improper from the context.

4. When a specific numerical value or quantity is referred to about objects or a physical quantity, numerical values or quantities over or below the specific numerical value or quantity are allowable except any case where it is evidently stated that this matter is improper, any case where the number of the objects or the physical quantity is theoretically limited to the specific numerical value or quantity, and any case where this matter is clearly interpreted to be improper from the context.

5. The wording "wafer" usually denotes a monocrystal silicon wafer (silicon-based semiconductor substrate) over which a semiconductor device, which may be referred to as a semiconductor integrated circuit device or an electronic device, is to be formed. However, it is needless to say that the wording includes, in the category thereof, an epitaxial wafer, and a composite wafer containing an insulated substrate plus a semiconductor layer or the like.

The wording "main surface of a wafer" is used to denote both of the topmost surface of a workpiece, which is changed in a wafer-related process, and a surface (substrate surface or epitaxial surface) of silicon as an original material. For the description of the process, the wording may denote different portions or areas of a laminated structure.

6. The wording "band-form repeated device pattern region" denotes a part of the inside of a chip region (the unit element area of the upper of a wafer) which has a pattern wherein individual pattern pieces (such as band-form highland regions, band-form valley regions or band-form middle-stage regions) are far longer in the longitudinal direction thereof than the repetition pitch of a line and space pattern or the like, examples of the wording including a source pad region of a trench gate type power MOSFET device. Herein, the "band-form" means a band form, a stripe form, or the like, and includes, in the category thereof, a bent-line form beside a straight-line form, and also includes therein the form of a band having a constant width, and the form of a band having a width varied in accordance with locations.

Details of the Embodiments

The embodiments will be described in more detail. In the individual figures, to the same members or portions or to members or portions similar to each other will be attached the same or similar symbols or reference numbers. The same or similar description will not be repeated.

1. Description of Outlines of Semiconductor Device and Method of Manufacturing Semiconductor Device (Semiconductor-Device-Manufacturing Method) of Embodiment of the Invention With Reference Mainly to FIGS. 1 to 4

Figure 3A:
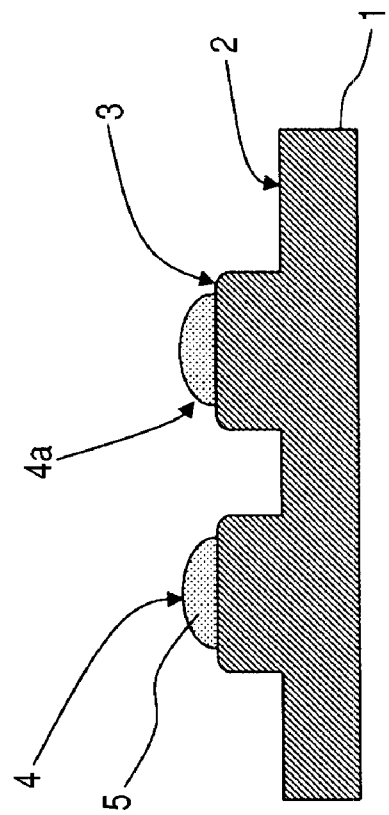
FIGS. 3(a) and 3(b) are each a sectional view of the main portion of the semiconductor device in main steps in the semiconductor-device-manufacturing method of the embodiment of the invention.
Figure 3B:
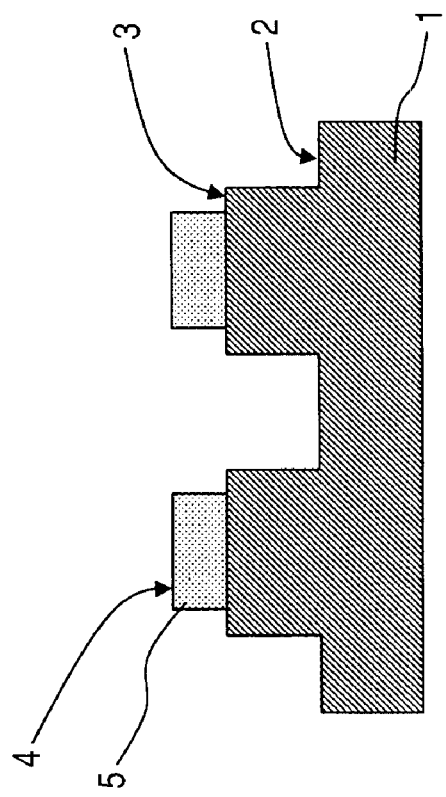

FIGS. 1(a) and 1(b) are views illustrating a semiconductor device manufactured by a semiconductor-device-manufacturing method of an embodiment of the invention, the former of which is a top view of a main portion of the device, and the latter of which is an X-X' sectional view of FIG. 1(a). FIG. 2 is a top view of the whole of this semiconductor device (semiconductor chip). In FIG. 2, the X-X' cross section is the same as in FIG. 1. FIGS. 3(a) and 3(b) are each a sectional view of the main portion of the semiconductor device in main steps in the semiconductor-device-manufacturing method of the embodiment of the invention. FIG. 4 is a comparing-data plotted chart wherein changes in aluminum-electrode sputtering-property when detailed conditions for the semiconductor-device-manufacturing method of the embodiment of the invention are variously changed are plotted on a graph showing a relationship between the set temperature of a wafer stage and the temperature of the rear surface of a wafer measured with a radiation thermometer. With reference to these figures, outlines of the semiconductor device and the semiconductor-device-manufacturing method of the embodiment of the invention will be described below.

As illustrated in FIG. 2, in a power MOSFET device chip 8 (trench gate power MOS semiconductor device), wherein devices are formed on a silicon-based semiconductor substrate in the form of a square or rectangular plate (the substrate being a wafer before the substrate is cut into individual chips), a main area thereof is occupied by a source pad region 11 (aluminum pad), which is present in the center. Beneath the region 11 is a band-form repeated device pattern region 12, in which many band-form gate electrodes (corresponding to columnar trench gate electrodes) extending adequately more lengthily than the width (or the pitch) thereof (specifically, the electrodes extending over substantially the same length as the entire width of the source pad region 11) are arranged to be alternated with many band-form source contact regions. In the vicinity thereof is a gate pad region 13 for leading out gate electrodes to the external from the vicinity. Furthermore, in the vicinity thereof is arranged an aluminum guard ring 10. The outermost circumferential region of the chip 8 is a region used when the wafer is divided by dicing or the like, that is, a scribe region 14. Enlarged figures of a portion of the band-form repeated device pattern region 12 are FIG. 1.

As illustrated in FIG. 1, the wafer, which is an epitaxial wafer 1, has a diameter of 200 mm in the embodiment. Giving this example, the invention will be specifically described hereinafter; however, the following description is not substantially varied when the wafer has a diameter of 300 mm or 450 mm. A main surface 1a of the body of the wafer 1 has a periodic structure wherein band-form middle stage regions 3 (corresponding to source contact regions) are alternated with band-form valley regions 2 (corresponding to body contact regions). Furthermore, an insulating film 5 is laid on the individual band-form middle stage regions 3, so as to form band-form highland regions 4 (corresponding to the upper surface of the insulating film 5). A relatively thin barrier metal film 6 is formed on this underlying structure, and then this underlying structure is covered with a relatively thick electrode metal film 7 comprising aluminum-based alloy (hereinafter referred to simply as "aluminum") as uniformly as possible.

However, according to the highland/lowland-repeated structure in a line and space form, voids are easily generated in the electrode metal film 7 near the band-form valley regions 2 or the band-form middle stage regions 3. Thus, situations that voids are generated have been examined under various conditions in connection with a correspondence-relationship between the rear surface temperature of such a wafer (hereinafter referred to as the "wafer temperature") and the set temperature of a stage for the wafer when aluminum is sputtering. The results are shown FIG. 4. In FIG. 4, the wording "WITHOUT ESC (electrostatic chuck)" denotes a matter that an electro-static chuck is turned off or is not used (no seed is used at this time). The wording "WITH ESC" denotes a matter that the electro-static chuck is turned on (no seed is used at this time). The wording "WITH SEED" denotes a matter that a thin aluminum film (seed layer or wetting layer) is formed at a temperature lower than the wafer temperature at the time of regular sputtering of aluminum (no electro-static chuck is used at this time).

As illustrated in FIG. 4, when the wafer temperature (temperature of the main portion thereof) is 400° C. or higher and lower than 500° C., good results are obtained. On the other hand, when the wafer temperature is lower than 400° C., many voids are generated. When the wafer temperature is 500° C. or higher, the aluminum film reacts with the barrier film, and others are caused so that etching residues are generated in a subsequent barrier-metal-patterning step. This may cause film-peeling by subsequent thermal treatment. The film-peeling is caused because Si in the aluminum film and Ti or W in the TiW film forms an alloy layer so that the film(s) become(s) a porous film or porous films.

On the basis of the above, the generation of voids can be largely reduced by setting the wafer temperature when aluminum is sputtering to 400° C. or higher and lower than 500° C., which is far higher than about 200° C., which is generally considered to be best. This is because aluminum atoms flow easily into the centers of the valleys at the higher temperatures. This countermeasure would produce a large effect for decreasing voids (bulk voids) generated, in particular, in the valley centers.

In order to decrease voids (surface voids) generated near the surface of the barrier metal 6 on the band-form middle stage regions 3, it is effective to form an aluminum wetting layer beforehand for the following reason: in a case where beneath the barrier layer (aluminum film) is laid a layer equal or similar in nature thereto as an underlying layer, aluminum atoms in lower end regions of the aluminum film flow more smoothly.

In order to cause the aluminum atoms to flow smoothly to decrease bulk voids or surface voids, it is effective that as illustrated in FIG. 3, tapered portions 4a (chamfered portions) are formed at both ends of each of the band-form highland regions 4, or both ends of each of the band-form middle stage regions 3 are tapered or chamfered besides the formation of the tapered portions 4a.

In the case of making the electro-static chuck into an operating state (on-state) at the time of regular sputtering of aluminum, the uniformity of the inside temperature of the wafer becomes good and in addition thereto the temperature-controllability of the whole of the wafer becomes good. On the other hand, in the case of making the electro-static chuck into a non-operating state (off-state) or using no electro-static chuck at the time of the formation of the aluminum wetting layer, an advantageous effect that an undesired rise in the wafer temperature is avoided is produced.

The above has specifically described one out of power MOSFETs having band-form gate electrodes. However, difficulty in prohibiting the generation of voids at the time of embedment using a thick aluminum film is true also about power MOSFETs having network-form gate electrodes for the following reason: while the chip-average hole-aperture ratio (the ratio of the area of contact holes in the area of the whole) of ordinary memory chips is about 5% (the ratio of SOCs is smaller), the chip-average hole-aperture ratio of power MOSFETs is generally about 25% so that the area to be embedded is overwhelmingly large; thus, these power MOSFETs, which are of different types, have a common problem that supply by reflow is insufficient. From the viewpoint of reflow distance, such a difference in the aperture ratio would become larger when a comparison is made only between the memory mat region and the region of the power MOSFETs where gates electrodes are densely arranged.

2. Description of Manufacturing Machine Used in Semiconductor-Device-Manufacturing Method of Embodiment of the Invention With Reference Mainly to FIGS. 6 to 8

Figure 6:
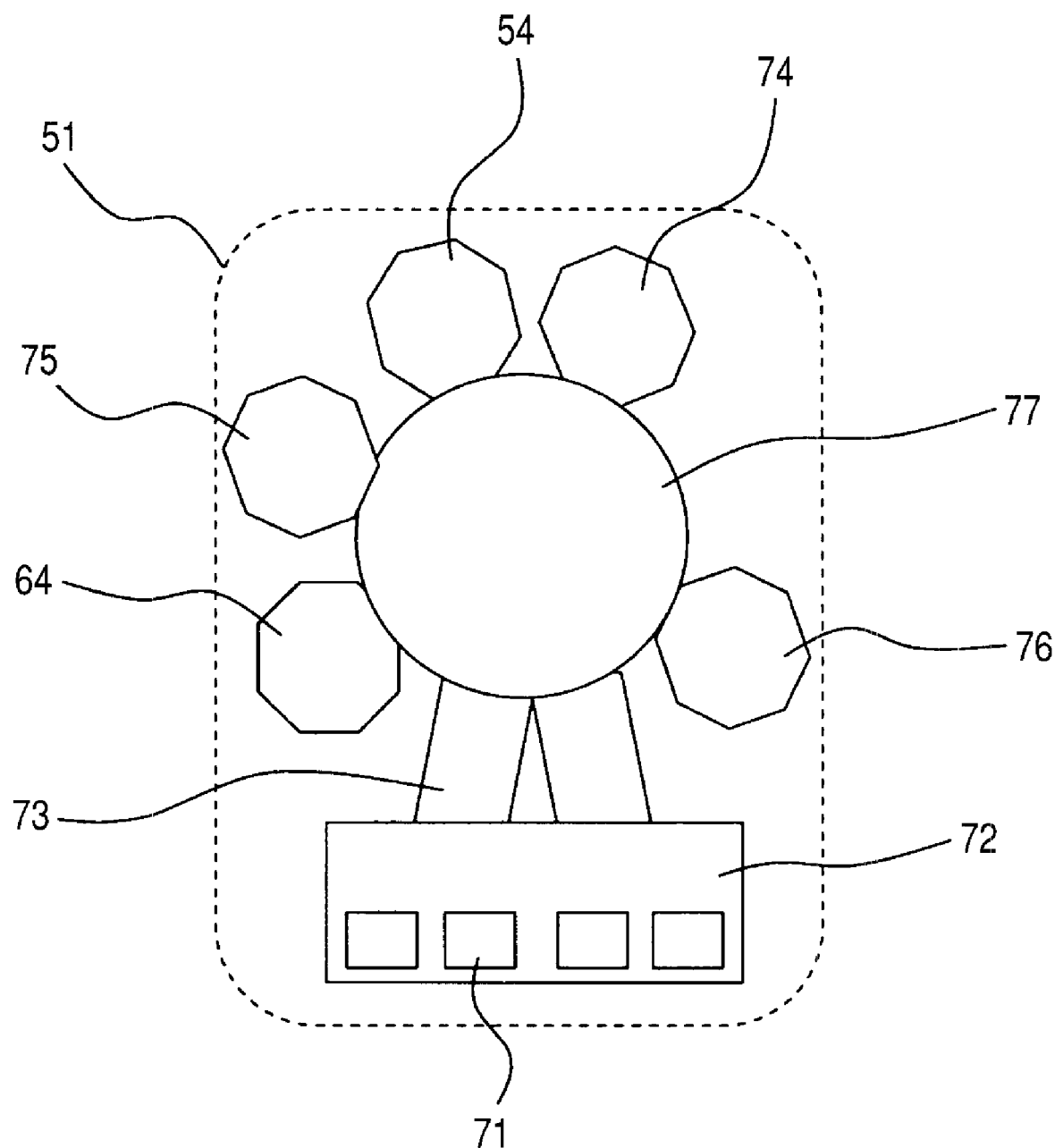
FIG. 6 is a top view of the whole of a semiconductor-device-manufacturing machine used in a semiconductor-device-manufacturing method of an embodiment of the invention.
Figure 7:
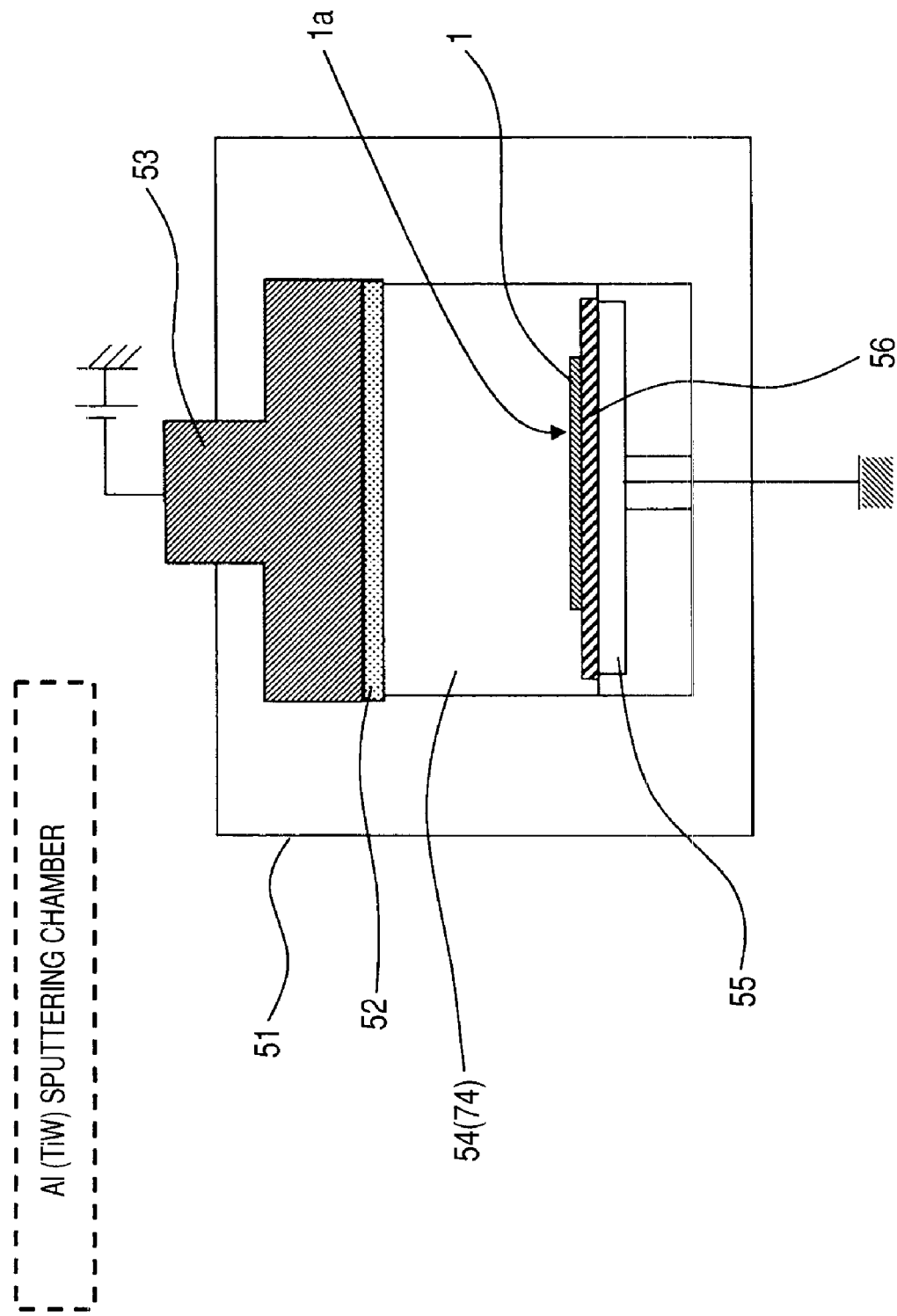
FIG. 7 is a front sectional view illustrating a detailed structure of an aluminum sputtering section (or a titanium tungsten sputtering section) of the semiconductor-device-manufacturing machine.
Figure 8:
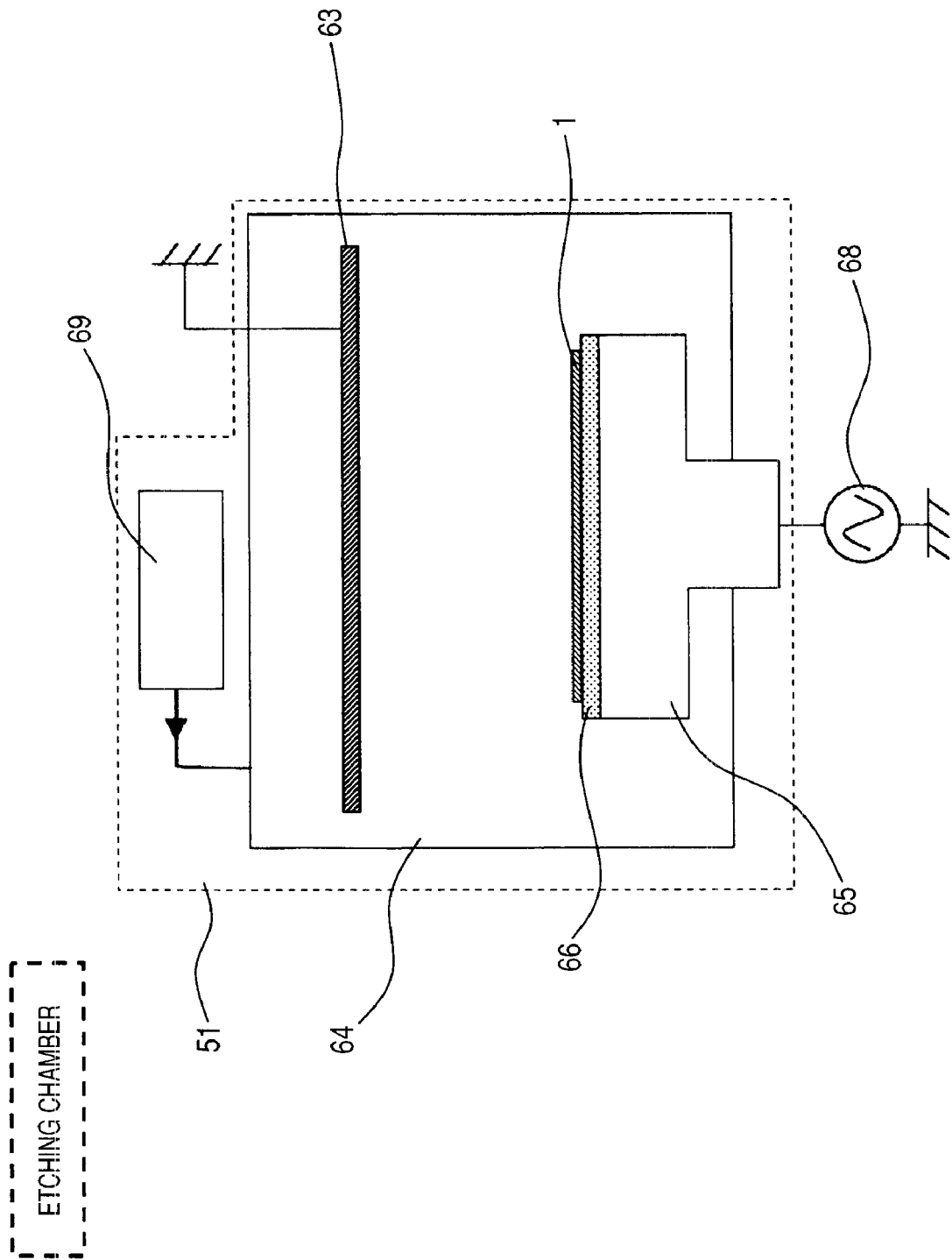
FIG. 8 is a front sectional view illustrating a detailed structure of a dry etching section of the semiconductor-device-manufacturing machine.

FIG. 6 is a top view of the whole of a semiconductor-device-manufacturing machine used in a semiconductor-device-manufacturing method of an embodiment of the invention. FIG. 7 is a front sectional view illustrating a detailed structure of an aluminum sputtering section (or a titanium tungsten sputtering section) of this semiconductor-device-manufacturing machine. FIG. 8 is a front sectional view illustrating a detailed structure of a dry etching section of this semiconductor-device-manufacturing machine. With reference to these figures, a main manufacturing machine used in the semiconductor-device-manufacturing method of the embodiment of the invention, which has been described in Section 1, will be described below.

As illustrated in FIG. 6, a sputtering machine (a MoSi sputtering chamber 75, an AlSi sputtering chamber 54 and a TiW sputtering chamber 74), a thermal treatment machine (a preheat treatment chamber 72), an etching machine (a dry etching chamber 64) and others, which are used in the manufacturing method, are substantially integrated into a cluster machine 51. This cluster machine 51 has a load port 72 which holds four wafer cassettes 71 at normal pressure. The wafers held in the load ports 72 are each passed through either one of two load lock chambers 73 and then passed through a vacuum transferring chamber 77, the inside of which has been converted to vacuum, so as to be supplied into each of the treatment chambers. When the wafers are discharged, the wafers are advanced reversely thereto.

Referring to FIG. 7, the following will describe the AlSi sputtering chamber 54 (the TiW sputtering chamber 74). As illustrated in FIG. 7, a wafer 1 is set up onto an electro-static chuck 56 on a wafer stage 55 in the state that a first main surface 1a (device surface) thereof is faced upwards. An exciting electrode 53 is arranged over the Si sputtering chamber 54. An AlSi sputtering target 52 (a TiW sputtering target in the case of the TiW sputtering chamber 74) is fitted to the lower surface of the electrode 53.

Referring to FIG. 8, the following will describe the dry etching chamber 64. As illustrated in FIG. 8, the wafer 1 is set up onto an electro-static chuck 66 on a lower electrode 65 in the same manner as described above. A high frequency electric power is coupled to the lower electrode 65. An upper electrode 63 is arranged in an upper portion of the dry etching chamber 64. Furthermore, argon gas and/or other required gasses is/are supplied from a gas supply system 69 into the dry etching chamber 64.

3. Description of Device Section Flowchart of Semiconductor-Device-Manufacturing Method of Embodiment of the Invention With Reference Mainly to FIG. 5 and FIGS. 9-24

Figure 5:
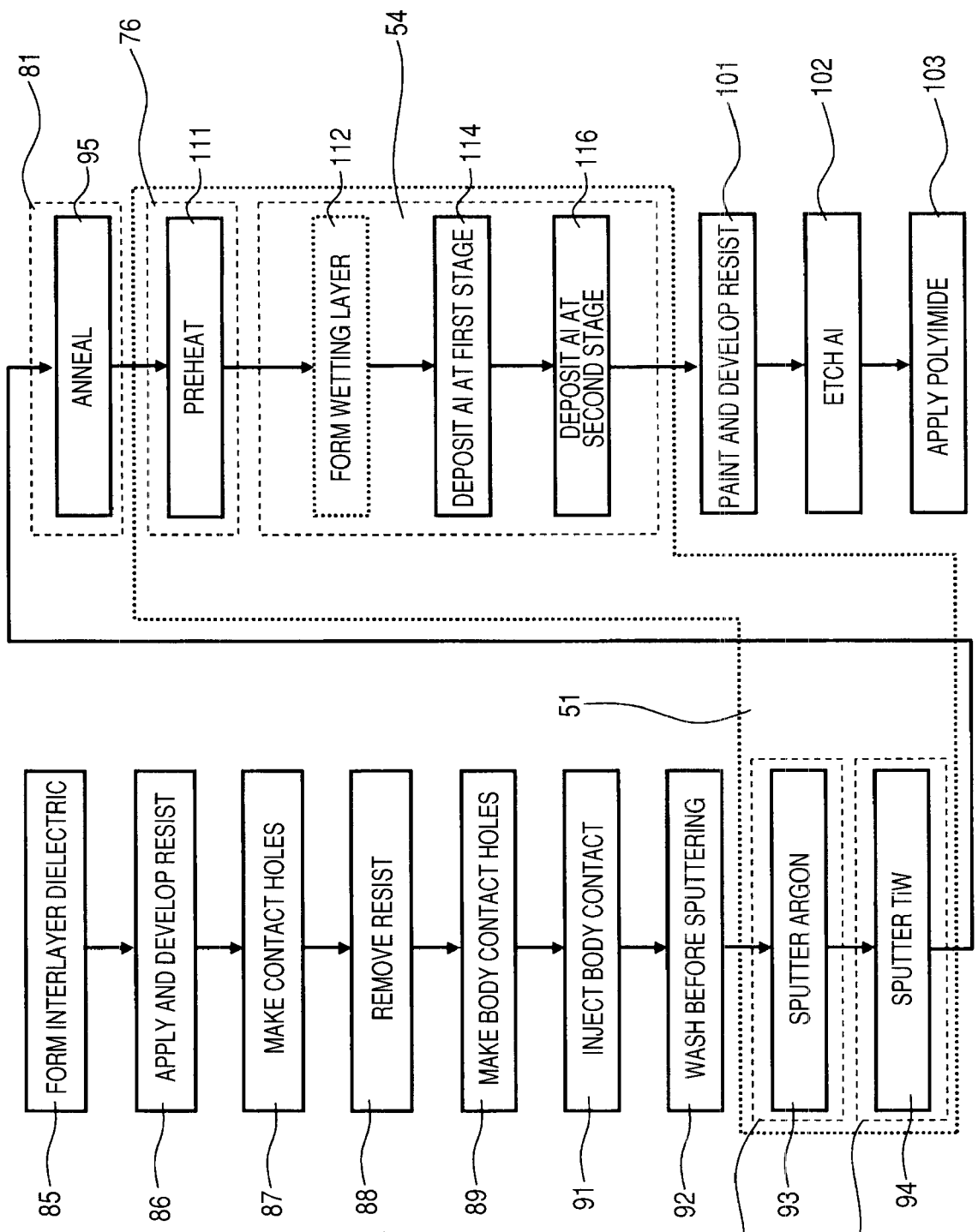
FIG. 5 is a manufacturing-process block flowchart of a semiconductor-device-manufacturing method of an embodiment of the invention.

FIG. 5 is a manufacturing process block flowchart of a semiconductor-device-manufacturing method of an embodiment of the invention. FIGS. 9 to 24 each illustrate details of a portion of a repeated pattern in an X-X' cross section of the inside of the device pattern region 12 illustrated in FIG. 2. With reference to FIG. 5 and FIGS. 9 to 24, the flow of the manufacturing process will be described below.

The structure of the wafer having the device pattern, which becomes an underlying element, will be described below, exemplifying the portion of the repeated pattern, which is in the X-X' cross section of the inside of the device pattern region 12 illustrated in FIG. 2 in one out of chip regions in a main surface region of the wafer.

Figure 9:
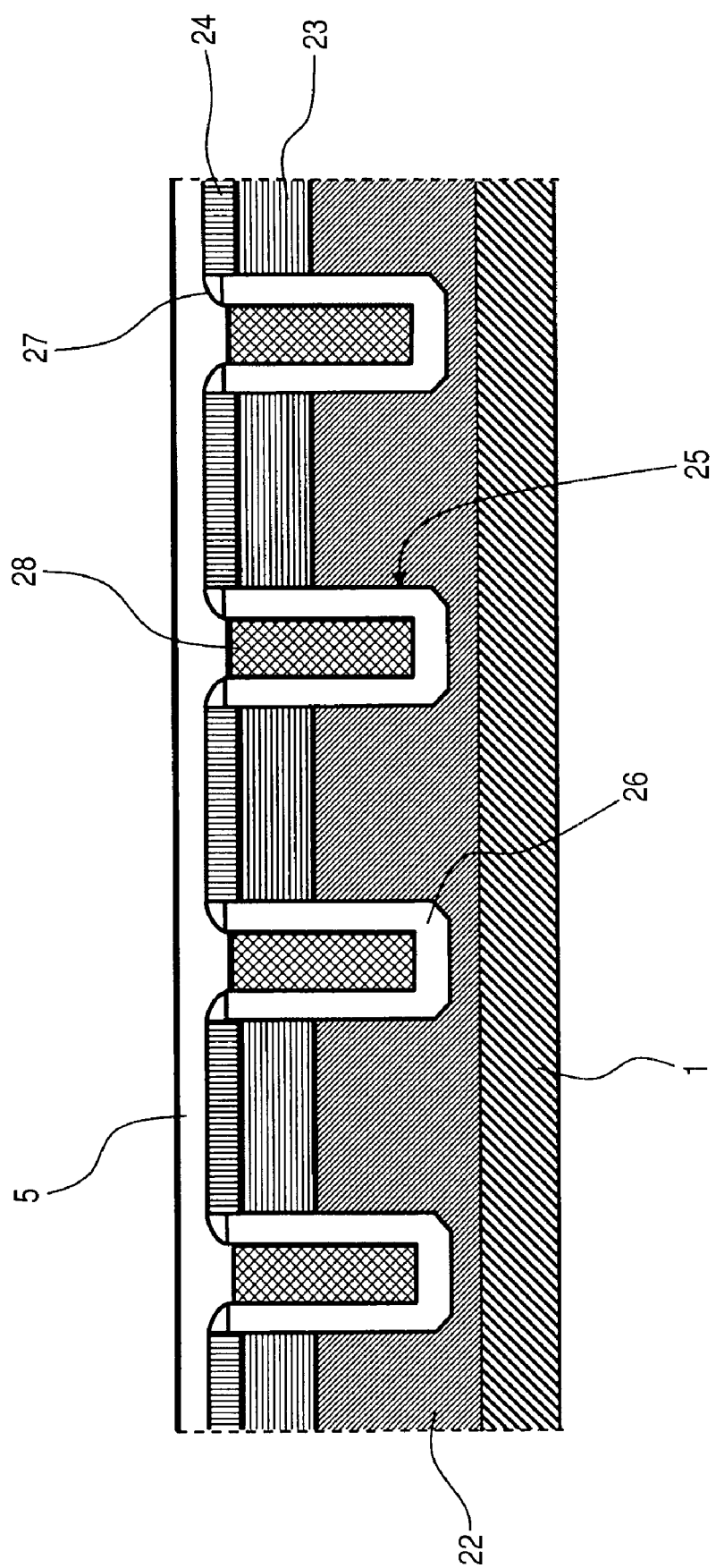
FIG. 9 is a device-cross-section view illustrating a process step (completion of an interlayer-dielectric-film-forming step) of a semiconductor-device-manufacturing method of an embodiment of the invention.

As illustrated in FIG. 9, an N-epitaxial layer 22 (corresponding to N-drift regions) having a thickness of about several micrometers is formed on a high-concentration N+ semiconductor substrate of Si monocrystal (corresponding to drain regions). Usually, materials formed till this step is made from a wafer as a starting material. Trenches 25 (slender grooves) each having a width of about 0.5 µm and a depth of about 3 µm are dug in this N-epitaxial layer from its first main surface side. Phosphorus-doped polysilicon gate electrodes 28 are embedded into the trenches 25 so as to interpose a gate insulating film 26 therebetween. A P-base region 23 (corresponding to a channel region) is formed on the upper of the N-epitaxial layer between any adjacent ones out of the trenches. Thereon are formed high-concentration N+ regions 24 (corresponding to source regions). Insulating side walls 27 are positioned at both sides of each of the high-concentration N+ regions 24.

As illustrated in FIG. 9, in this state, an interlayer dielectric 5 is formed on the first main surface 1a of the wafer (the main surface at this time being the upper surface of the high-concentration N+ regions 24, the insulating side walls 27, and phosphorus-doped polysilicon gate electrodes 28 or an insulating film thereon in this case) (interlayer-dielectric-forming step 85 in FIG. 5). The interlayer dielectric 5 is, for example, a film wherein a CVD-PSG film about 600 nm in thickness, as a lower layer, is combined with an SOG film about 100 nm in thickness, as an upper layer.

Figure 10:
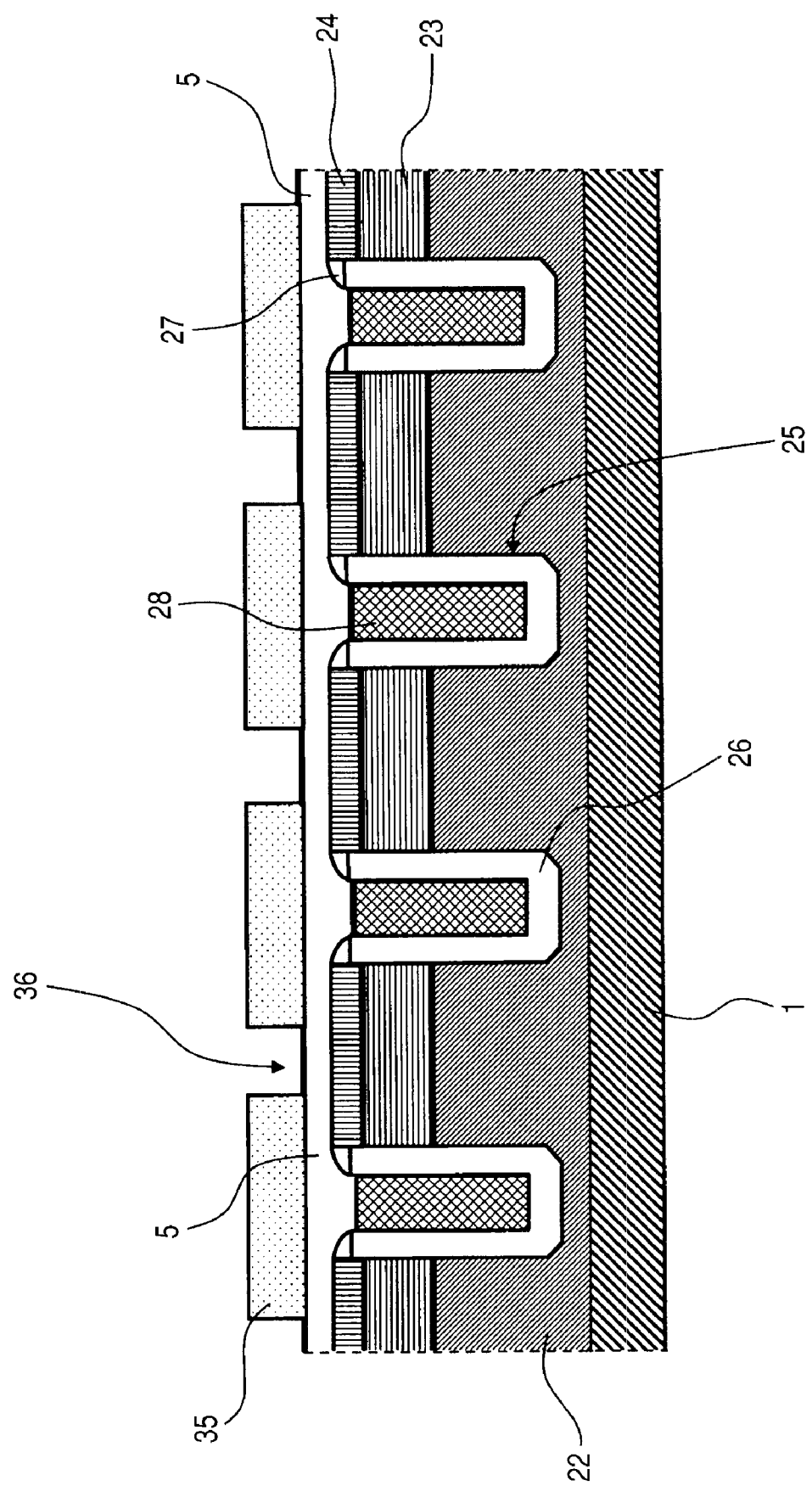
FIG. 10 is a device-cross-section view illustrating a process step (completion of the step of forming a resist pattern for working the interlayer dielectric film) of the semiconductor-device-manufacturing method.
Figure 11:
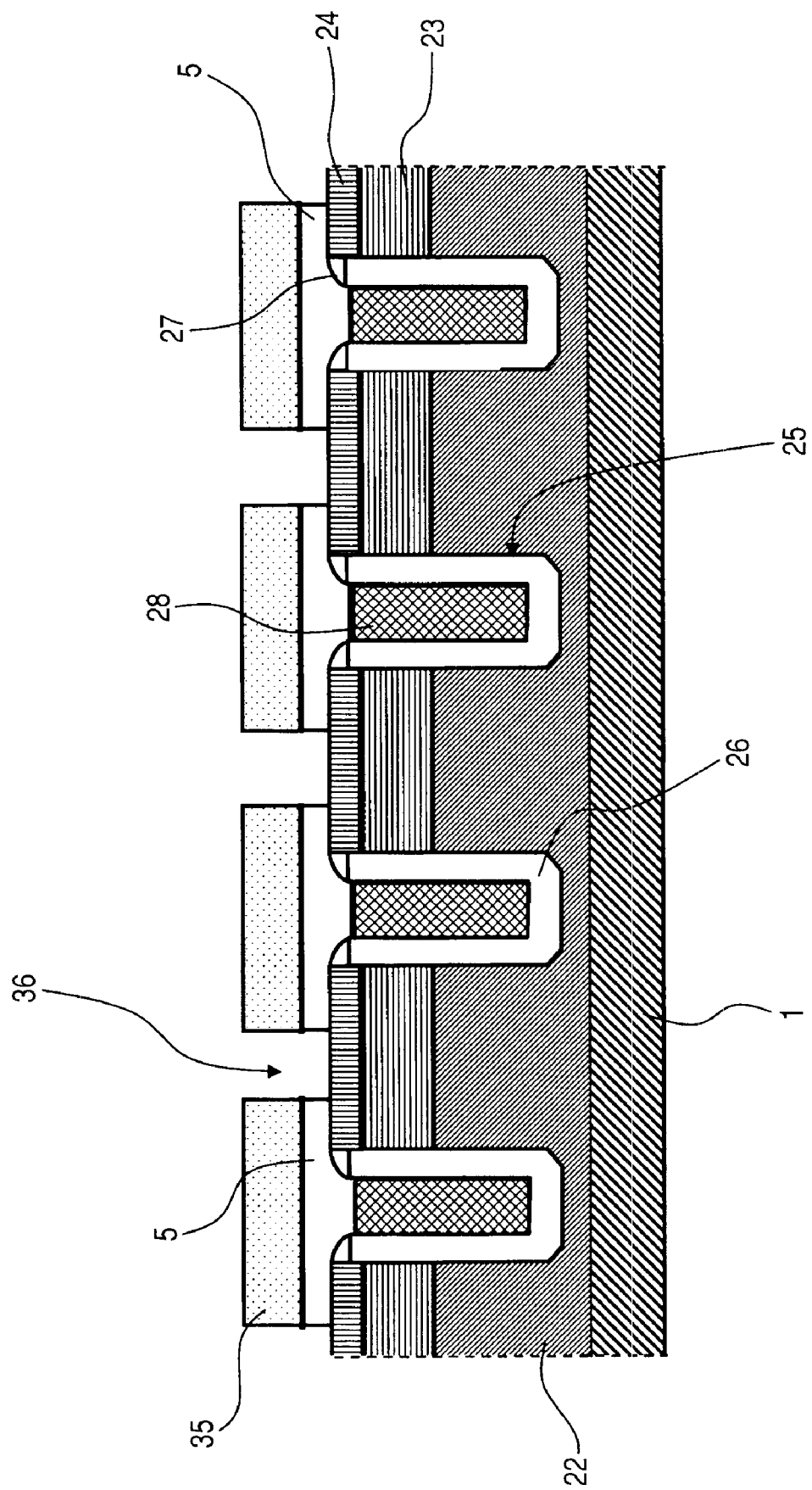
FIG. 11 is a device-cross-section view illustrating a process step (completion of an interlayer-dielectric-film-working step) of the semiconductor-device-manufacturing method.
Figure 12:
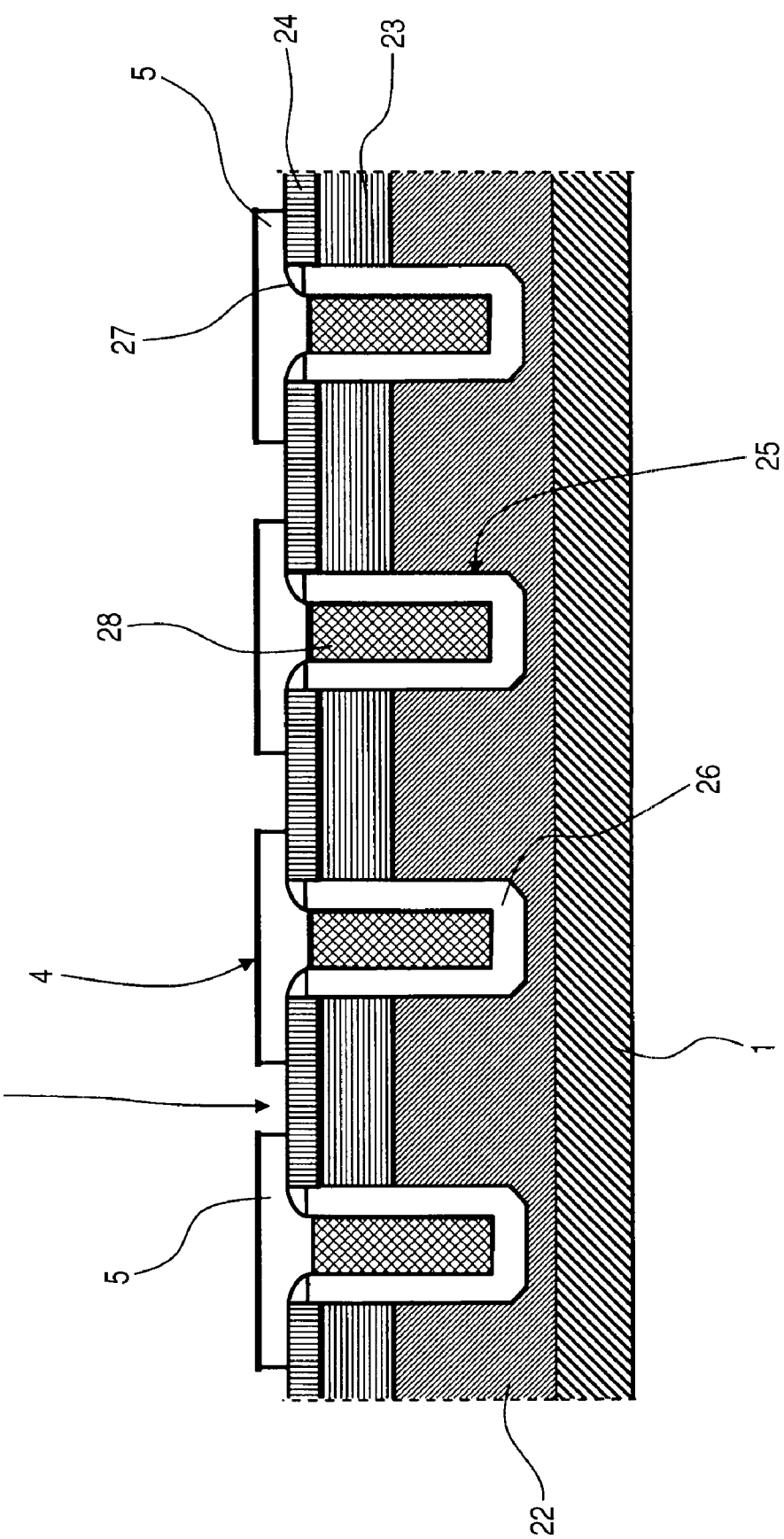
FIG. 12 is a device-cross-section view illustrating a process step (completion of the step of removing the resist pattern for working the interlayer dielectric film) of the semiconductor-device-manufacturing method.
Figure 13:
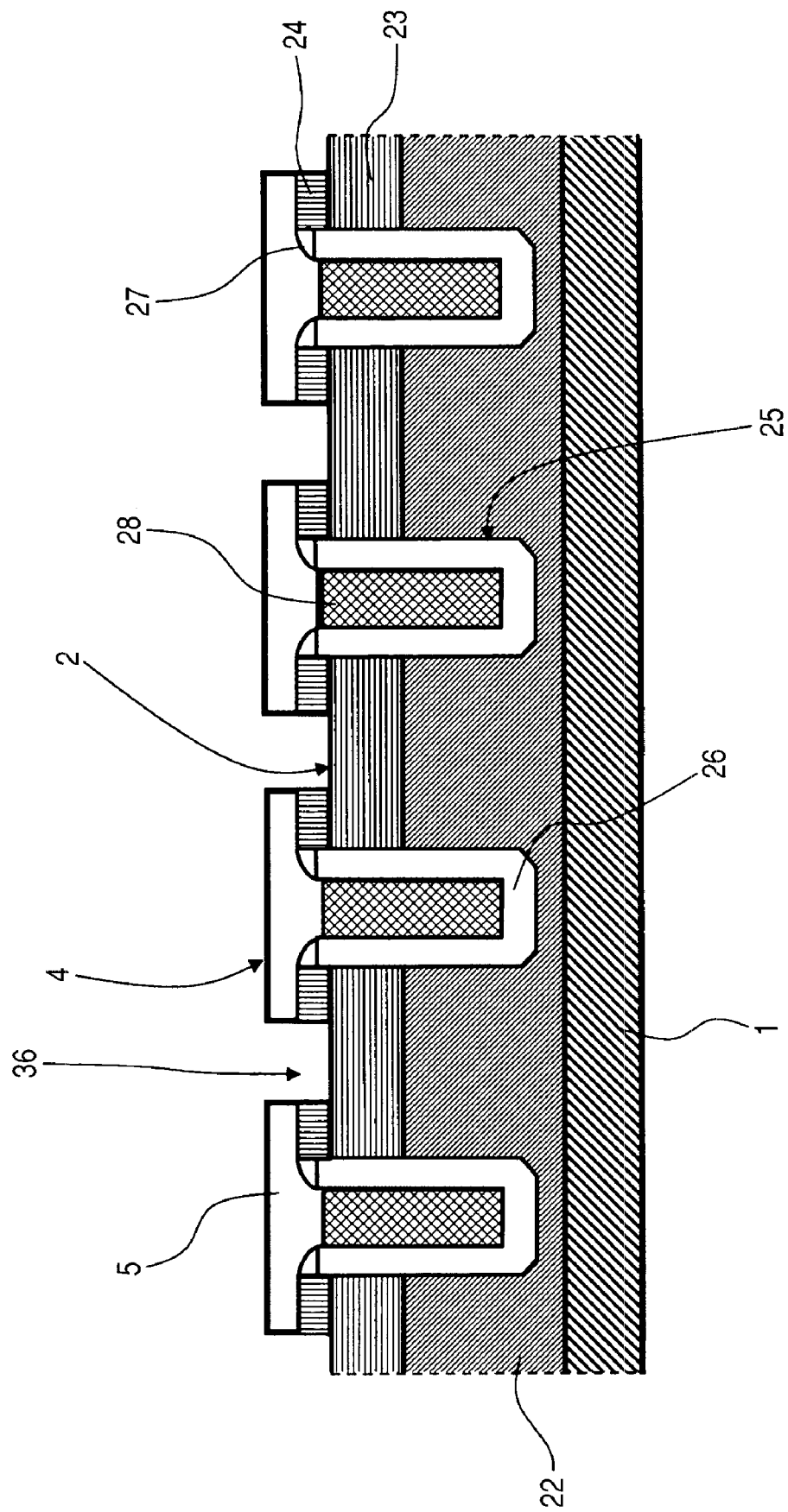
FIG. 13 is a device-cross-section view illustrating a process step (completion of a body-contact-substrate-etching step) of the semiconductor-device-manufacturing method.
Figure 14:
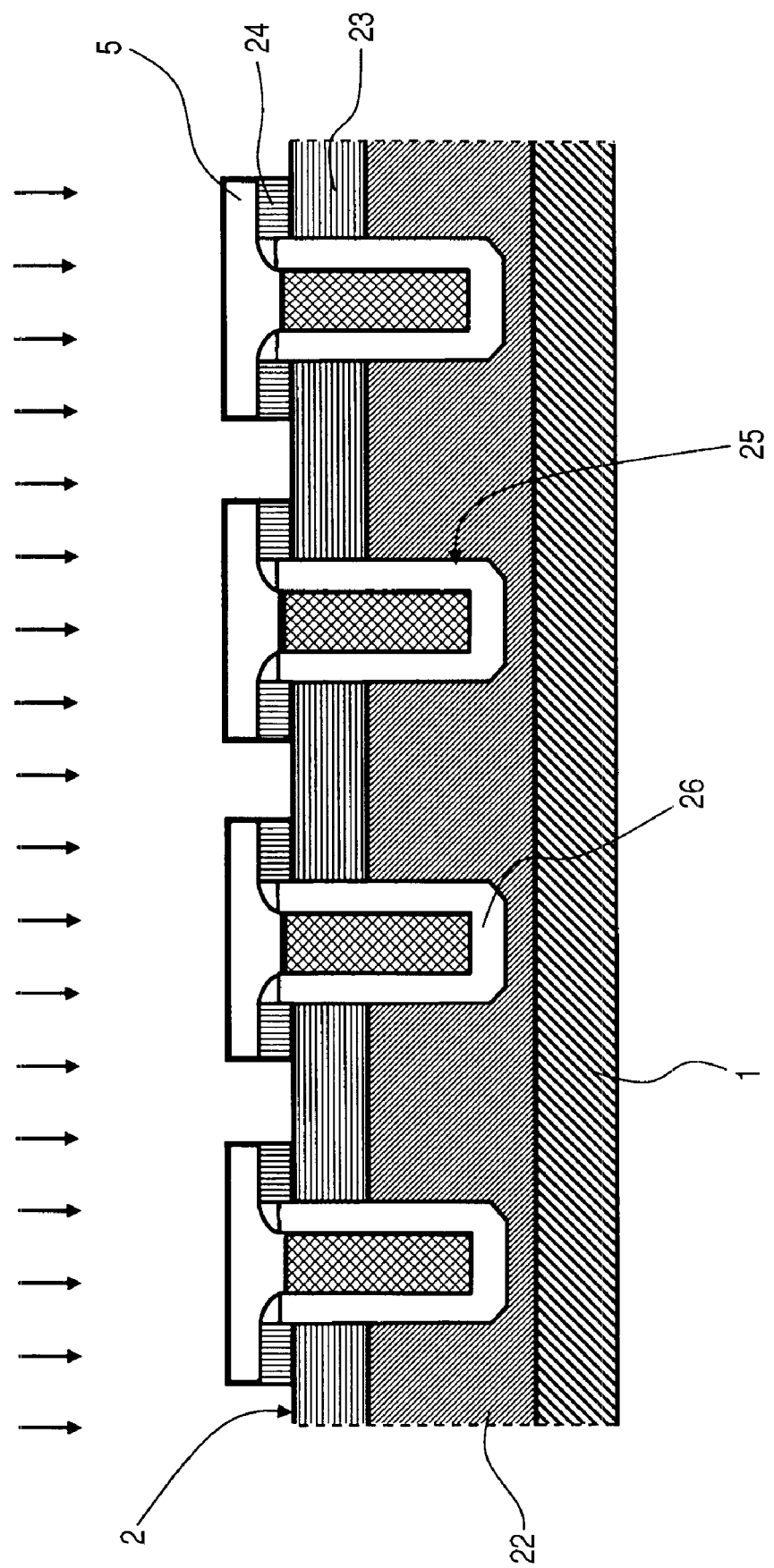
FIG. 14 is a device-cross-section view illustrating a process step (completion of the step of ion-implantation into body-contact high-concentration P type regions) of the semiconductor-device-manufacturing method.
Figure 15:
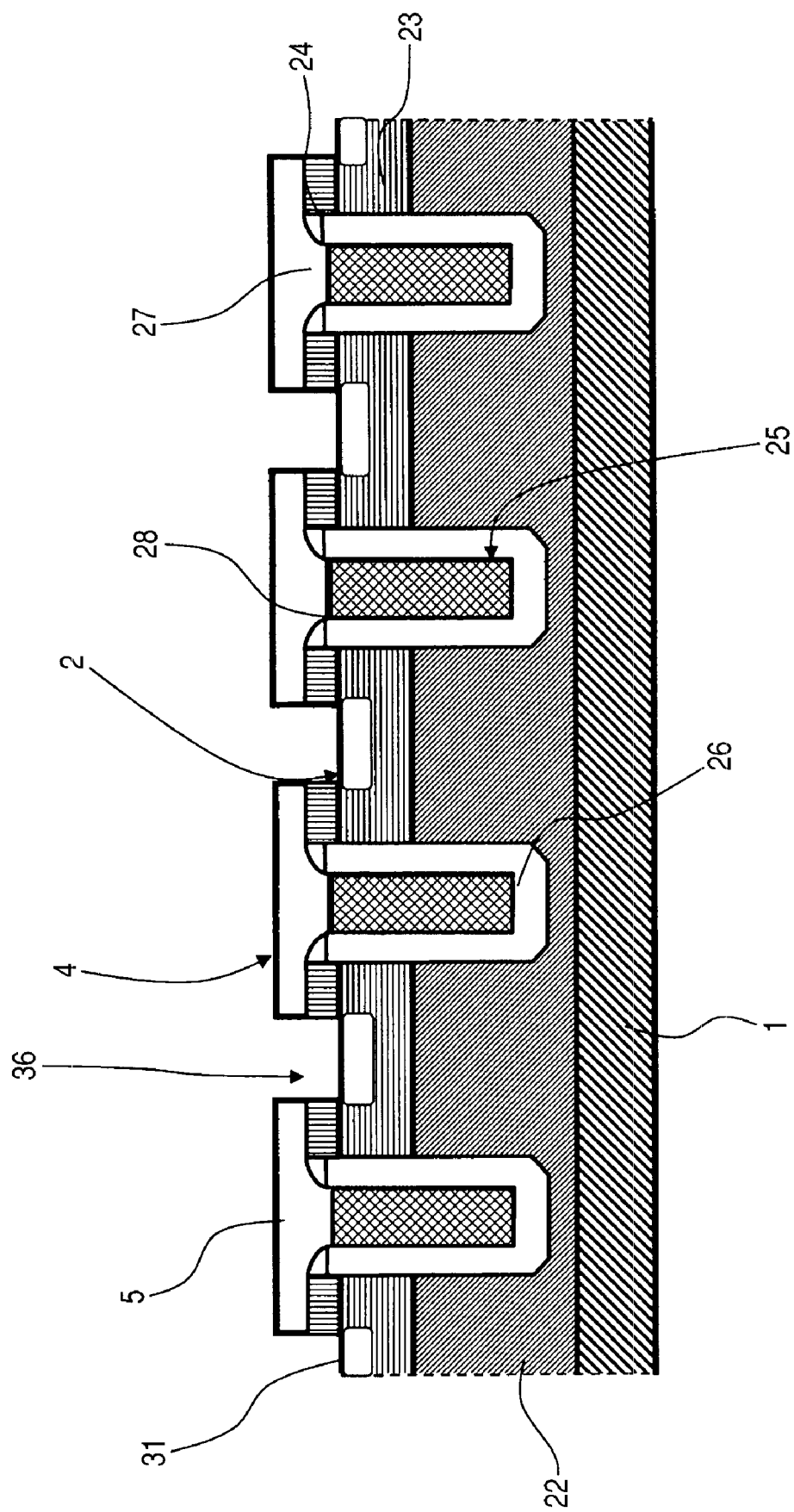
FIG. 15 is a device-cross-section view illustrating a process step (completion of an annealing step after the ion-implantation into the body-contact high-concentration P type regions) of the semiconductor-device-manufacturing method.

Next, as illustrated in FIG. 10, a resist pattern 35 (photoresist) is formed by ordinary lithography in order to make contact openings 36 (openings in the form of long trenches) (resist-applying and developing step 86). Next, as illustrated in FIG. 11, this resist pattern 35 is used to make openings 36 in the interlayer dielectric 5 by dry etching using, for example, fluorocarbon gas (contact-hole-making step 87 in FIG. 5). Next, as illustrated in FIG. 12, the resist pattern 35 is removed (resist-removing step 88 in FIG. 5). Furthermore, as illustrated in FIG. 13, the patterned interlayer dielectric 5 is used as an etching-resistant mask to subject the workpiece to dry etching in an atmosphere containing, for example, chorine gas and oxygen gas, thereby digging the silicon layer of the substrate beneath the contact hole regions 36 to make body contact holes reaching the P-base regions 23 (body-contact-hole-making step 89 in FIG. 5). Next, as illustrated in FIG. 14, the patterned interlayer dielectric 5 is used as an ion-implanting-resistant mask to implant ions of a P type impurity (such $BF_2$) into the P-base regions 23 so as to give a high ion concentration thereto (body-contact-implantation step 91 in FIG. 5). Thereafter, the workpiece is subjected to annealing treatment to form P+ body contact regions 31 as illustrated in FIG. 15.

Figure 16:
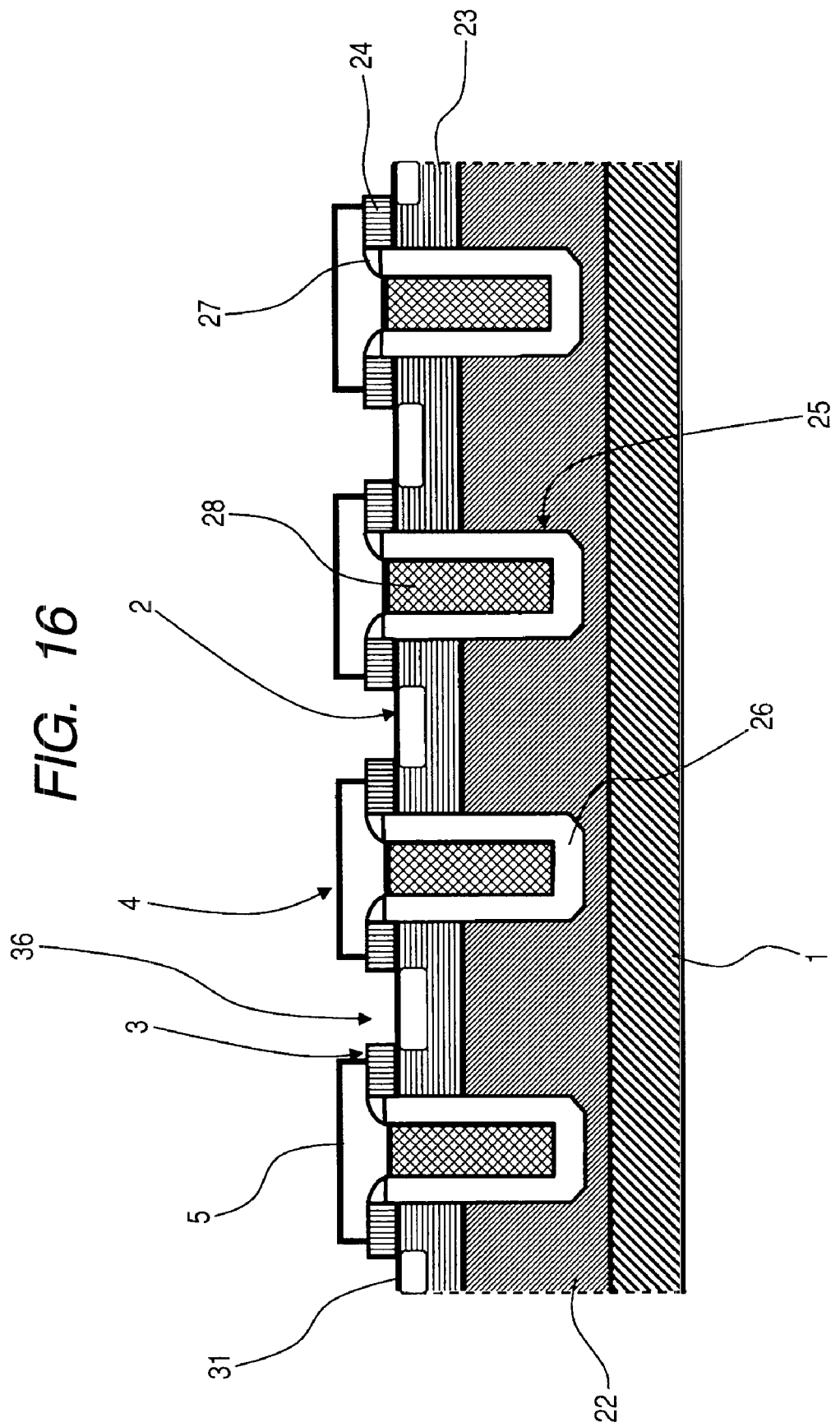
FIG. 16 is a device-cross-section view illustrating a process step (completion of a TiW-sputtering-preceding-washing step) of the semiconductor-device-manufacturing method.
Figure 17:
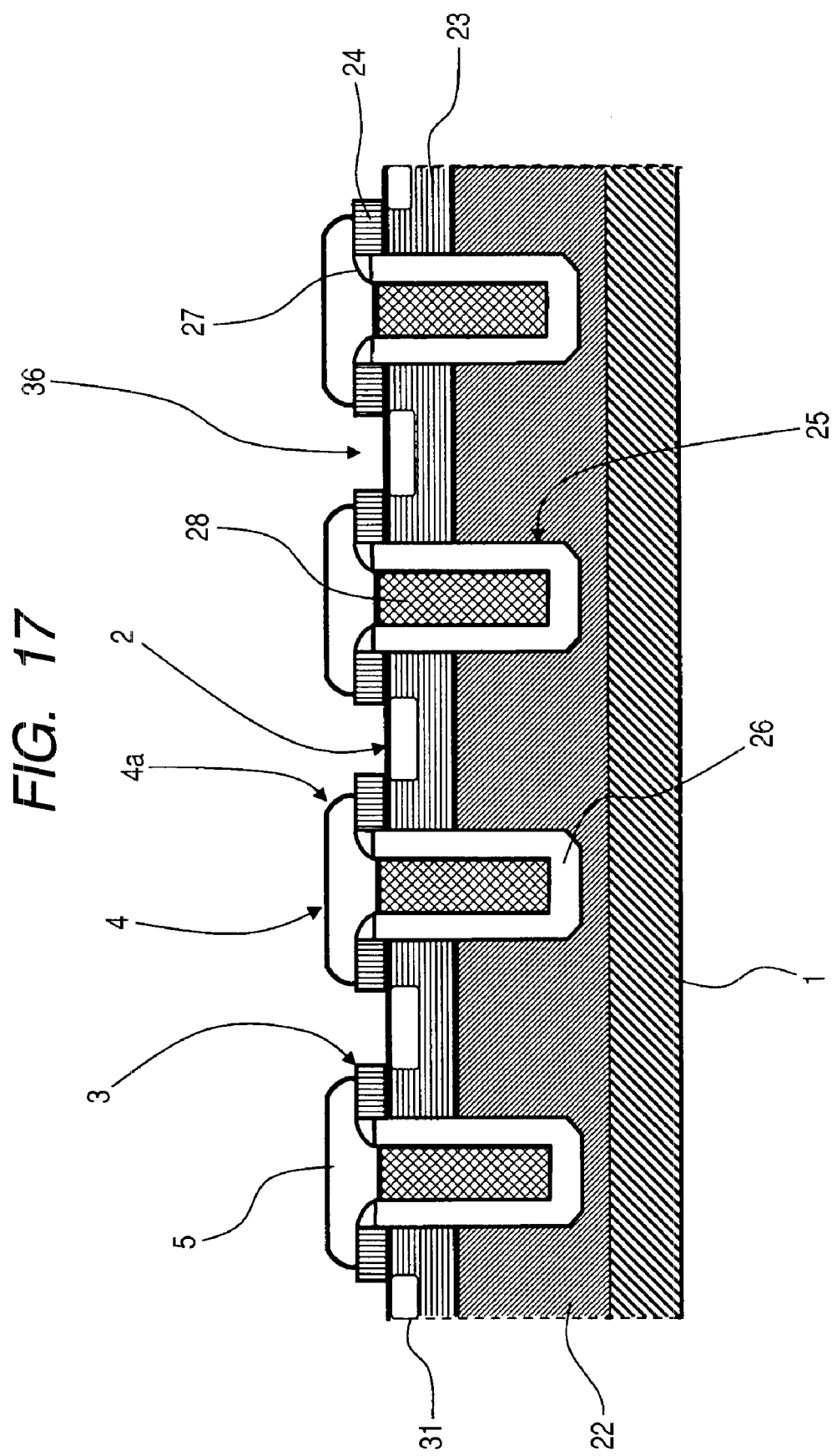
FIG. 17 is a device-cross-section view illustrating a process step (completion of a rounding dry etching step) of the semiconductor-device-manufacturing method.
Figure 18:
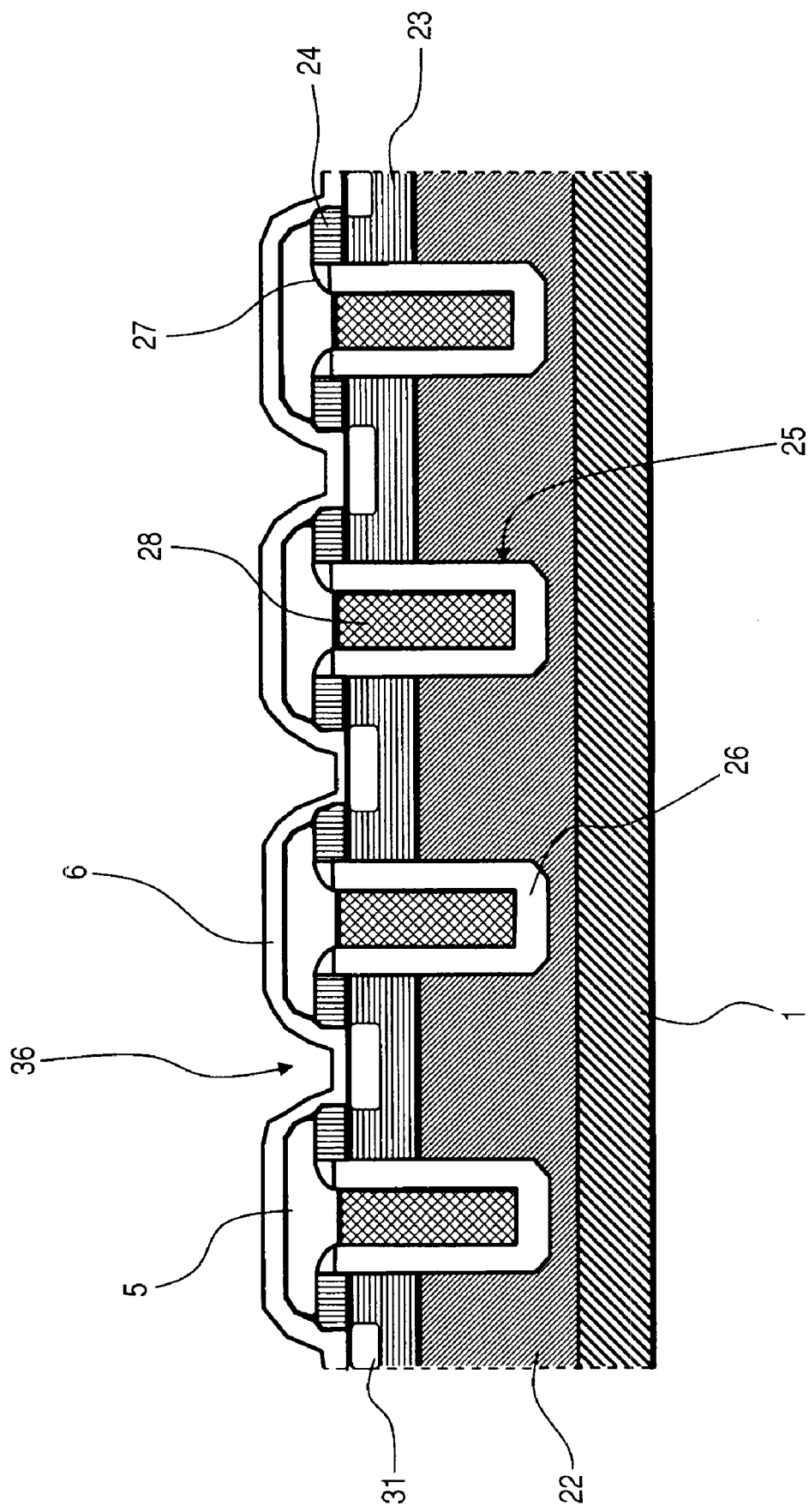
FIG. 18 is a device-cross-section view illustrating a process step (completion of a TiW-sputtering step) of the semiconductor-device-manufacturing method.

Next, as illustrated in FIG. 16, the workpiece is subjected to wet etching treatment with a mixed solution of hydrofluoric acid and ammonium fluoride (ratio by weight of the former to the latter: 1/20). This treatment also acts as washing before sputtering. In this way, the interlayer dielectric 5 is etched off by, for example, about 80 nm to form stepwise structures (band-form middle stage regions 3) (sputtering-preceding-washing step 92 in FIG. 5). Thereafter, the workpiece is introduced into the cluster machine 51, and then subjected to degassing treatment, for example, at about 200° C. for about 45 seconds in a thermal treatment chamber 76 (atmosphere: argon, and pressure: 0.5 Pa). Thereafter, the wafer 1 is transferred as it is to the etching chamber 64. In the etching chamber 64, the workpiece is subjected to sputtering etching treatment (for example, at a high frequency (60 MHz) power of 90 W under a pressure of 0.5 Pa for about 25 seconds) in the atmosphere of argon so as to etch off the surfaces by about 20 nm. As illustrated in FIG. 17, in this way, tapered portions 4a are formed at individual both ends of the band-form middle stage regions 3 and the band-form highland regions 4 (argon-sputtering step 93 in FIG. 5). Instead of this sputtering etching treatment, isotropic dry etching or any other tapered-form-generating treatment may be conducted. Next, the wafer 1 is transferred to the TiW sputtering chamber 74. As illustrated in FIG. 18, in this TiW sputtering chamber 74, the workpiece is subjected to sputtering-film-forming treatment, for example, at a set wafer-temperature of 100° C. and a direct current power of 3 kw in the atmosphere of argon (pressure: 0.5 Pa) for about 1 minute, so as to form a TiW film 6 about 200 nm in thickness on the entire surface (TiW-sputtering step 94). In the TiW film 6, Ti is finally shifted through a subsequent thermal treatment step, so that the TiW film 6 will be separated into a TiSi layer as a lower layer and a remaining TiW layer as an upper layer. However, illustration thereof is complicated; thus, in any figure, the TiW film 6 when formed is illustrated as it is. The TiW film may be a film comprising titanium and tungsten as principal components. If necessary, the material of the film formed by sputtering may be a different barrier metal material.

Thereafter, the wafer 1 is taken out from the cluster machine 51, and transferred to an annealing machine 81. Therein, the workpiece is subjected to annealing treatment at 650° C. and normal pressure in the atmosphere of nitrogen for about 10 minutes (annealing-step 95 in FIG. 5).

Figure 19:
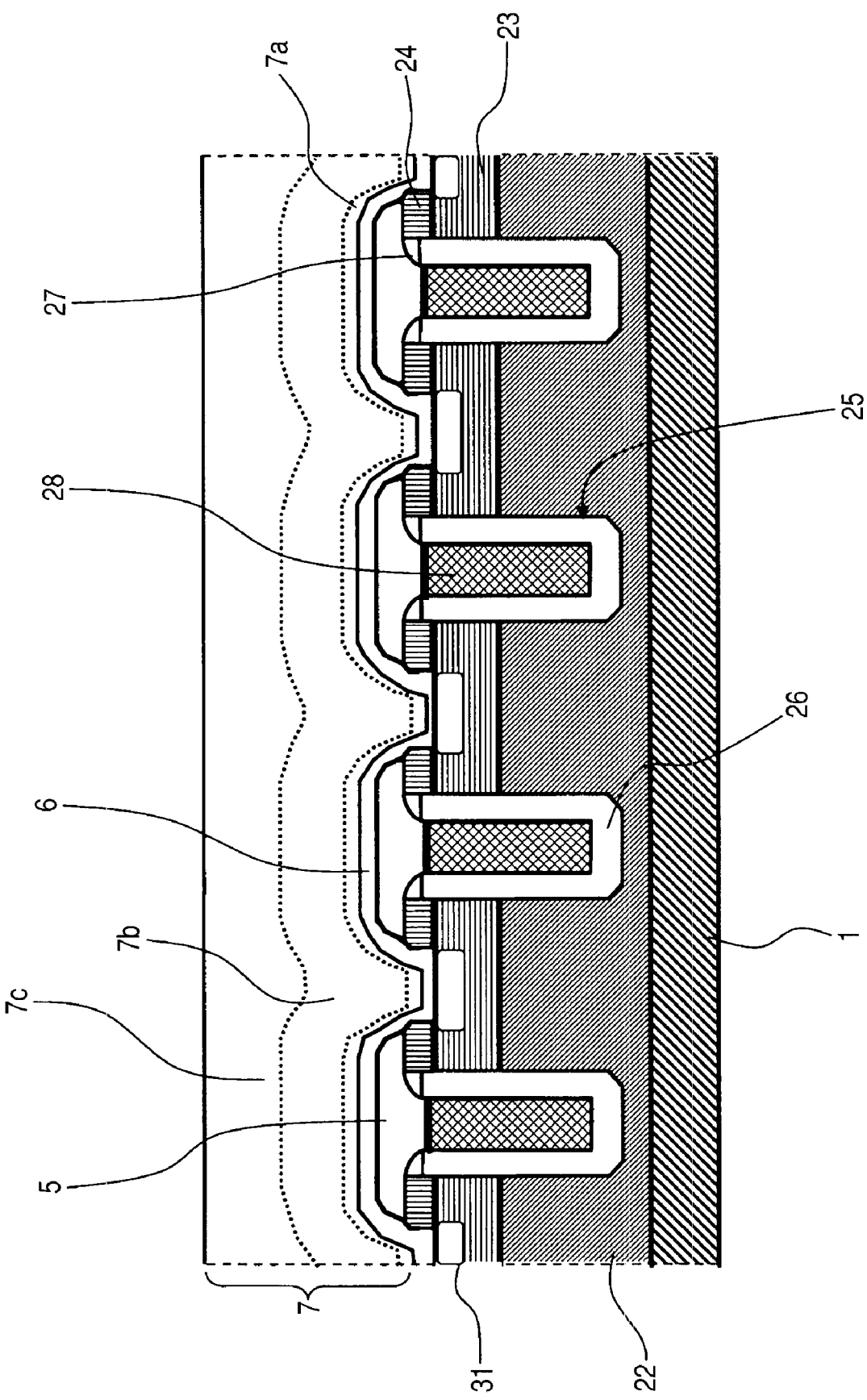
FIG. 19 is a device-cross-section view illustrating a process step (completion of an Al-alloy-sputtering step) of the semiconductor-device-manufacturing method.

Subsequently, the wafer 1 is again returned to the cluster machine 51, and then subjected to preheat treatment in the thermal treatment chamber 76 (preheat treatment step 111 in FIG. 5) in the same way as descried above. Thereafter, the workpiece is transferred to the aluminum sputtering chamber 54. As illustrated in FIG. 19, therein, an aluminum seed film 7a (aluminum to which silicon is added in an amount of about 1%) is formed into a thickness of about 200 nm (less than 0.5 µm) on the entire surface by sputtering, for example, at a pressure of 0.5 Pa in the atmosphere of argon (wetting-layer-forming step 112 in FIG. 5). The conditions (the atmosphere, the pressure, the target and others) in the step are substantially the same as in a main stage (first stage) of a subsequent aluminum-film-forming step. However, they are different from each other in that in the present step the wafer temperature is a somewhat lower temperature, which is from about 200° C. (lower than 400° C.), and the electro-static chuck 56 is in an off-state. The electro-static chuck 56 is turned off in this way in order to avoid a rise in the wafer temperature as much as possible to restrain the movement of aluminum atoms, thereby forming aluminum thinly and evenly on the whole of the wafer.

After the formation of the aluminum seed film 7a, the electro-static chuck 56 is turned on in the state that the workpiece is kept as it is. Simultaneously, the wafer temperature (actual temperature of the rear surface of the wafer, that is, a value measured with a radiation thermometer) is set to 400° C. or higher and lower than 500° C. As illustrated in FIG. 19, in this state, a first-stage aluminum film 7b is formed into a thickness of about 1500 nm on the entire surface by sputtering (first-stage aluminum-depositing step 114 in FIG. 5). The film 7b is an aluminum film to which silicon is added in an amount of about 1%. In the step, the same target as for the seed film is used. It is allowable to use a different target having the same composition or a different target having a different composition. At the time of this step, an argon atmosphere (flow rate thereof: for example, 80 sccm) is used, and the direct current power is, for example, about 18 kw. The electro-static chuck 56 is in an on-state in order to make the temperature of the whole of the wafer even.

After the formation of the first-stage Al film 7b, the wafer 1 is returned to one of the wafer cassettes 1 (FIG. 6). About all wafers, including the wafer 1, first-stage aluminum films 7b are formed. After the completion of the formations, the wafer 1 is again transferred to the aluminum sputtering chamber 54. As illustrated in FIG. 19, therein, a second-stage aluminum film 7c is formed into a thickness of about 1800 nm, which is thicker than the first-stage aluminum film, onto the entire surface by sputtering (second-stage aluminum-depositing step 116 in FIG. 5). The film 7c is an aluminum film to which silicon is added in an amount of 1%. In this embodiment, the same target as for the seed film is used. Conditions in this step are substantially the same as in the first-stage aluminum-depositing step; however, the direct current power is controlled into a somewhat lower value of about 14 kw for the following reason: in the first stage, it is necessary to form the aluminum film speedily before the aluminum atoms move in order to prevent the aluminum atoms from moving to form overhangs or the like; on the other hand, in the second stage, it is necessary to form the aluminum film slowly in order to cause the aluminum atoms to move sufficiently. When the formation of the second-stage aluminum film 8c is completed, the wafer is returned to one of the wafer cassettes 71 (FIG. 6). About all wafers, including the wafer 1, second-stage aluminum films 7c are formed. After the completion of the formations, the wafers, in the unit of a batch, are discharged to the outside of the cluster machine 51. As described herein, the aluminum film 7 (film thickness: 2.5 μm or more) is made of the three layers, which includes the seed layer 7a. In the above-mentioned processes of forming the individual aluminum films, the same machine, the same sputtering chamber, and the same target are used, the target being a highly pure aluminum target containing silicon in an amount of several percent or less in order that each of films to be formed will contain silicon in an amount of about 1% or several percent or less. If necessary, the target may contain other additives such as copper at a level of several percent or less. The above has described one of examples where the wafer 1 is once returned to one of the wafer cassettes 71 after the formation of the first-stage aluminum film 7b; treatments of all wafers are completed; and then the second-stage aluminum-depositing step 116 is performed. However, in a case where another aluminum sputtering chamber is arranged inside the cluster machine 51, it is allowable that the first-stage aluminum film 7b is formed and successively the second-stage aluminum-depositing step 116 is performed. This way makes it possible to make the treating period short.

Figure 20:
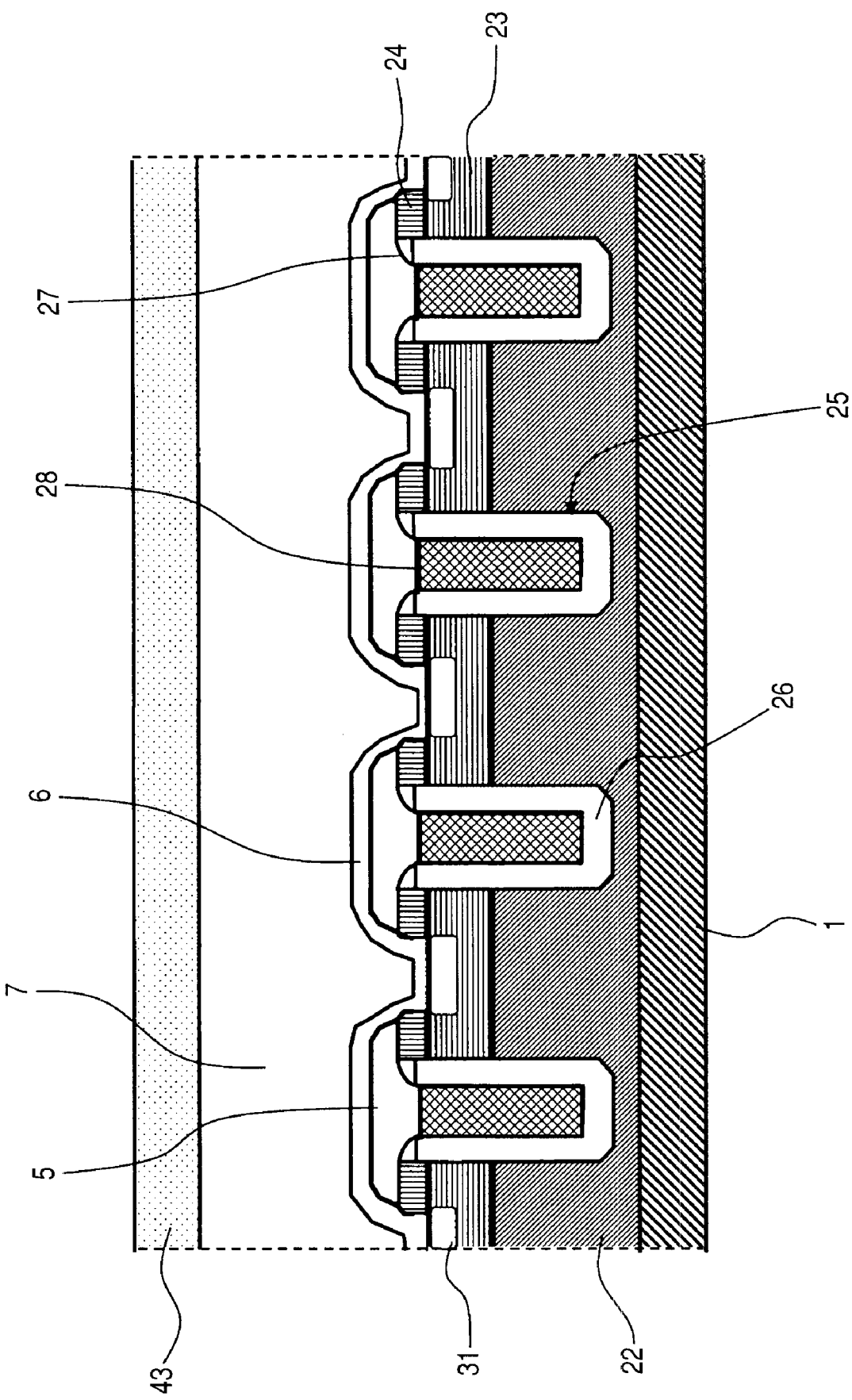
FIG. 20 is a device-cross-section view illustrating a process step (completion of the step of forming a resist pattern for Al-electrode-patterning) of the semiconductor-device-manufacturing method.
Figure 21:
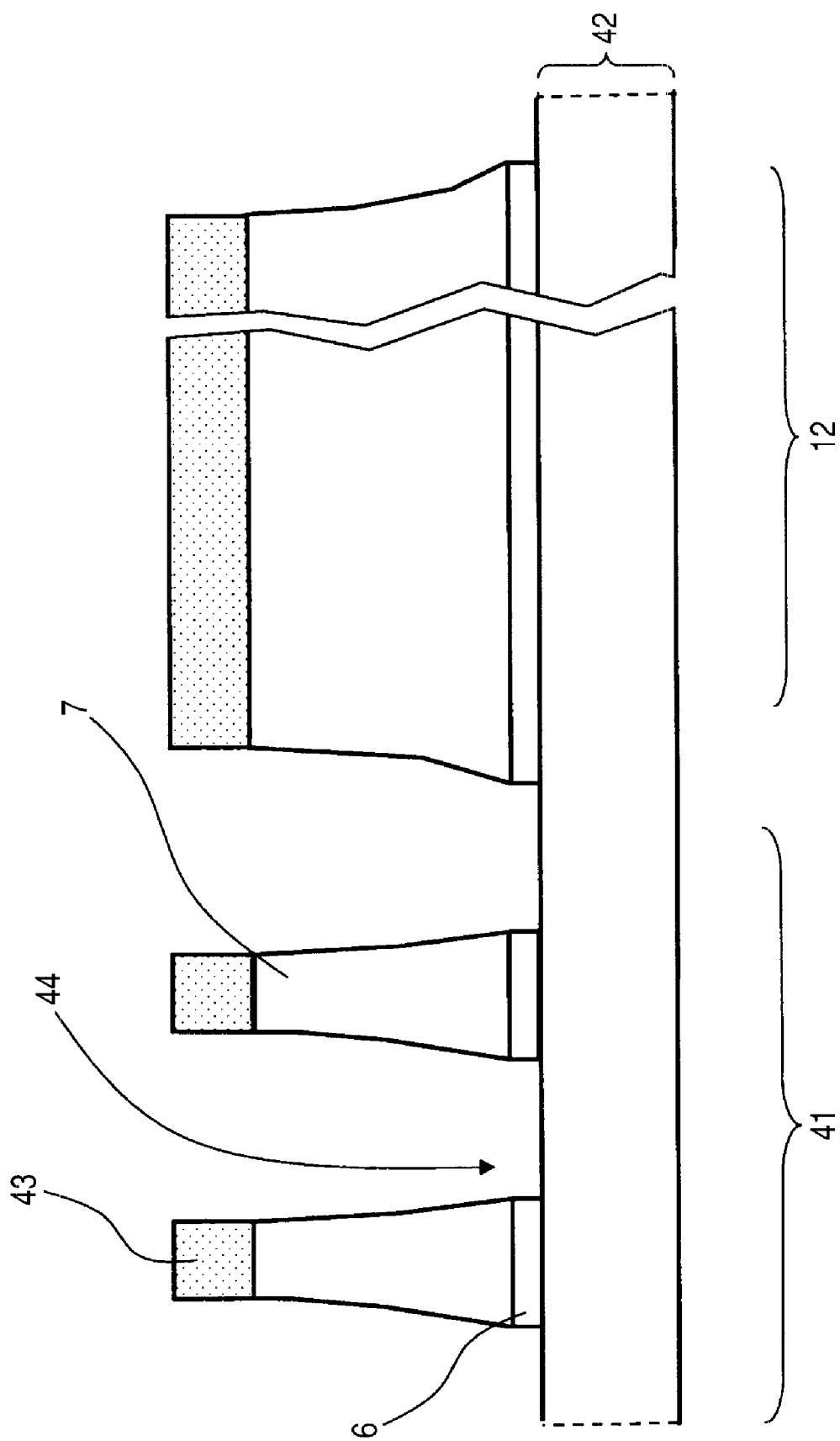
FIG. 21 is a device-cross-section view illustrating a process step (completion of an Al-electrode-pattering step and a TiW-dry-etching step) of the semiconductor-device-manufacturing method.

Next, as illustrated in FIG. 20, a resist film 43 is applied onto the aluminum film 7, and the film is patterned by ordinary lithography in the same way as described above (resist-applying and developing step 101 in FIG. 5). Furthermore, as illustrated in FIG. 21, the resist film 43 is used as a mask to pattern the aluminum film 7 by wet etching using a spin etching device (Al-etching step 102 in FIG. 5). The etchant used in this step is, for example, a mixed acid solution wherein acetic acid, nitric acid, water, and phosphoric acid (in an amount over 70% by weight) are mixed.

Next, in the state that the patterned resist film 43 is present, the TiW film is patterned by dry etching, so as to form openings 44 reaching an underlying layer 42, which contains the wafer 1. As illustrated in FIG. 21, inside the band-form repeated device pattern region 12 (or source pad region 11), the aluminum film 7 and the TiW film remain on the entire surface thereof; therefore, an actually patterned region is only a region 41 other than the region 12.

Figure 22:
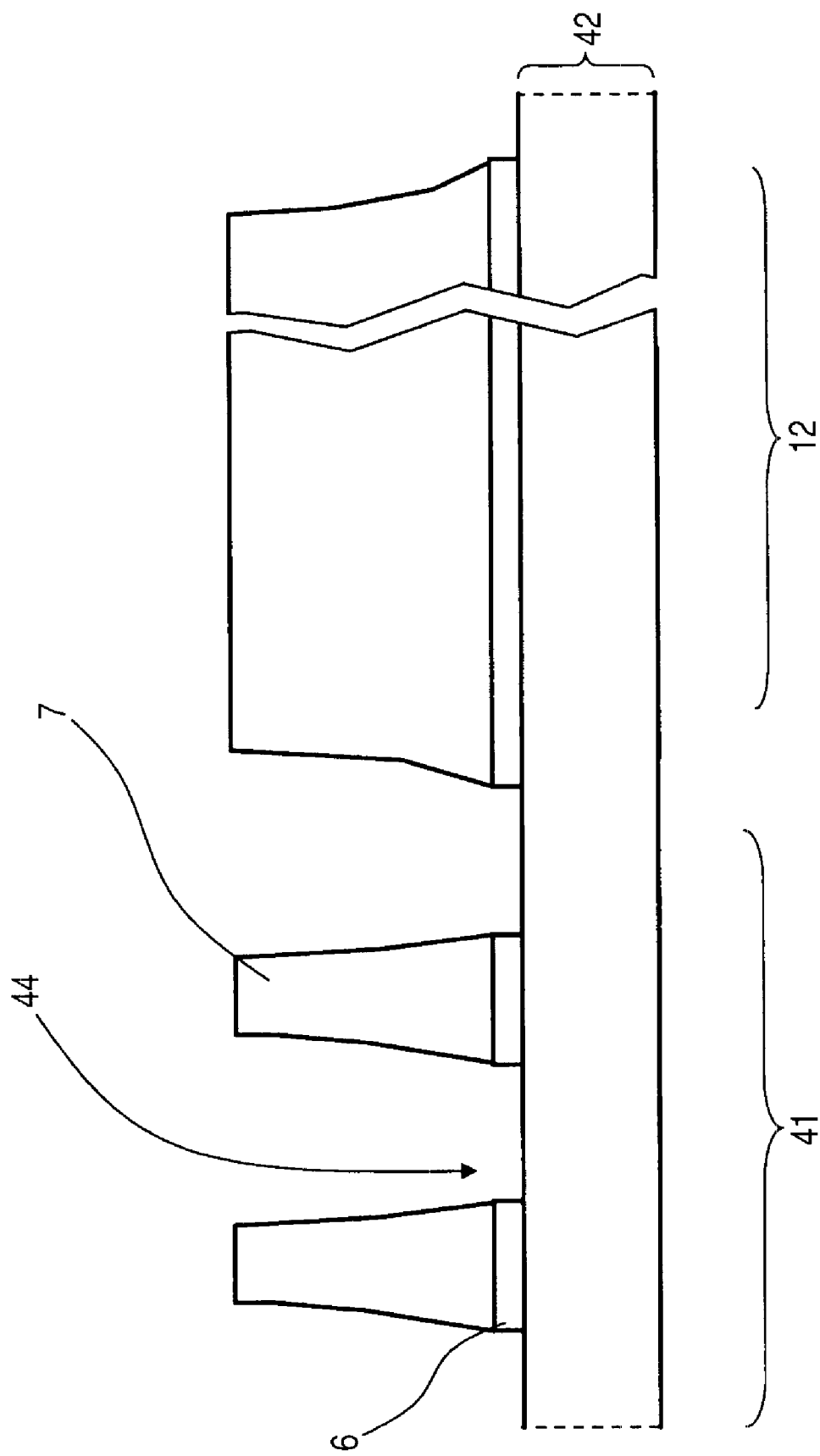
FIG. 22 is a device-cross-section view illustrating a process step (completion of the step of removing the resist pattern for Al-electrode-patterning) of the semiconductor-device-manufacturing method.
Figure 23:
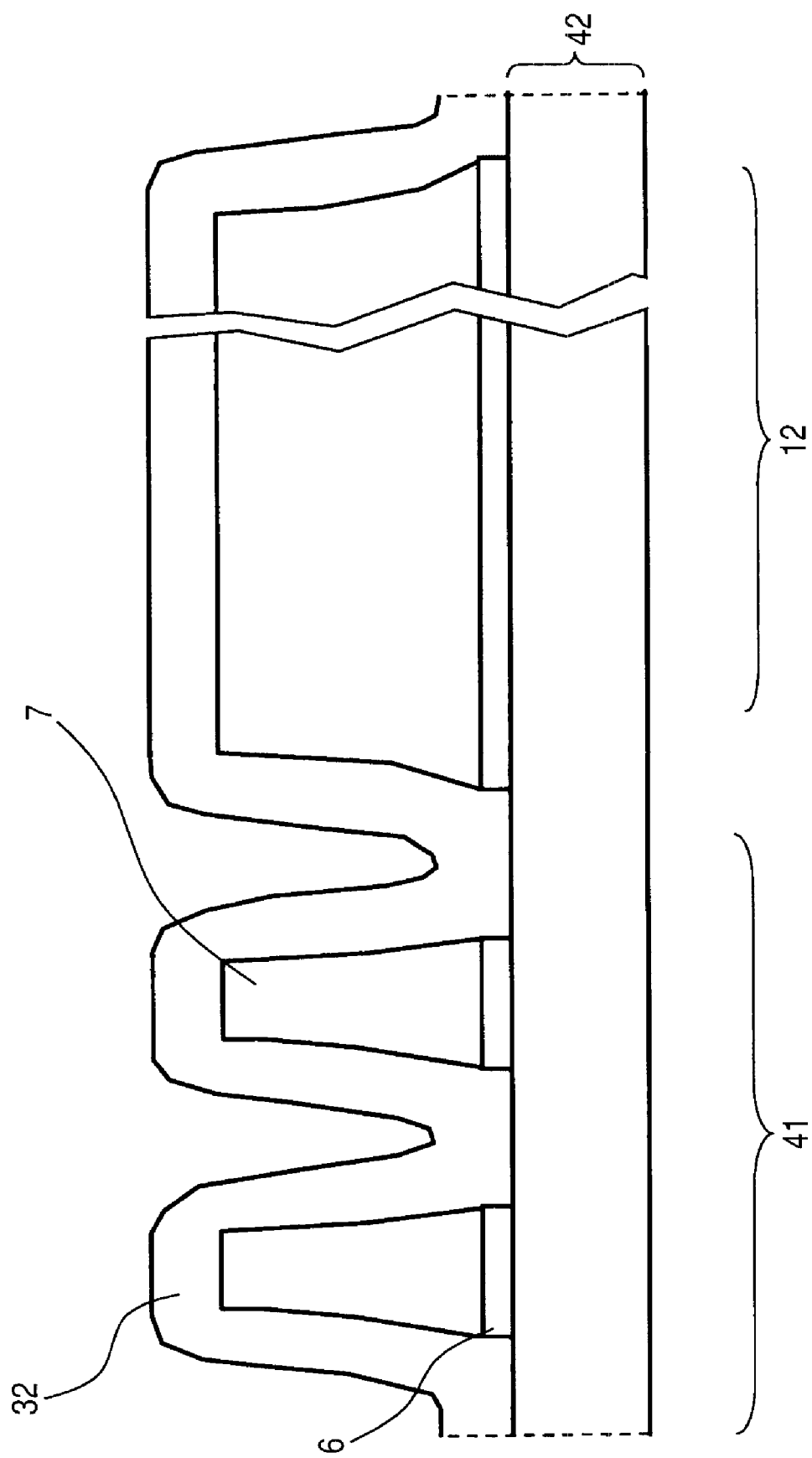
FIG. 23 is a device-cross-section view illustrating a process step (completion of a polyimide-applying step) of the semiconductor-device-manufacturing method.
Figure 24:
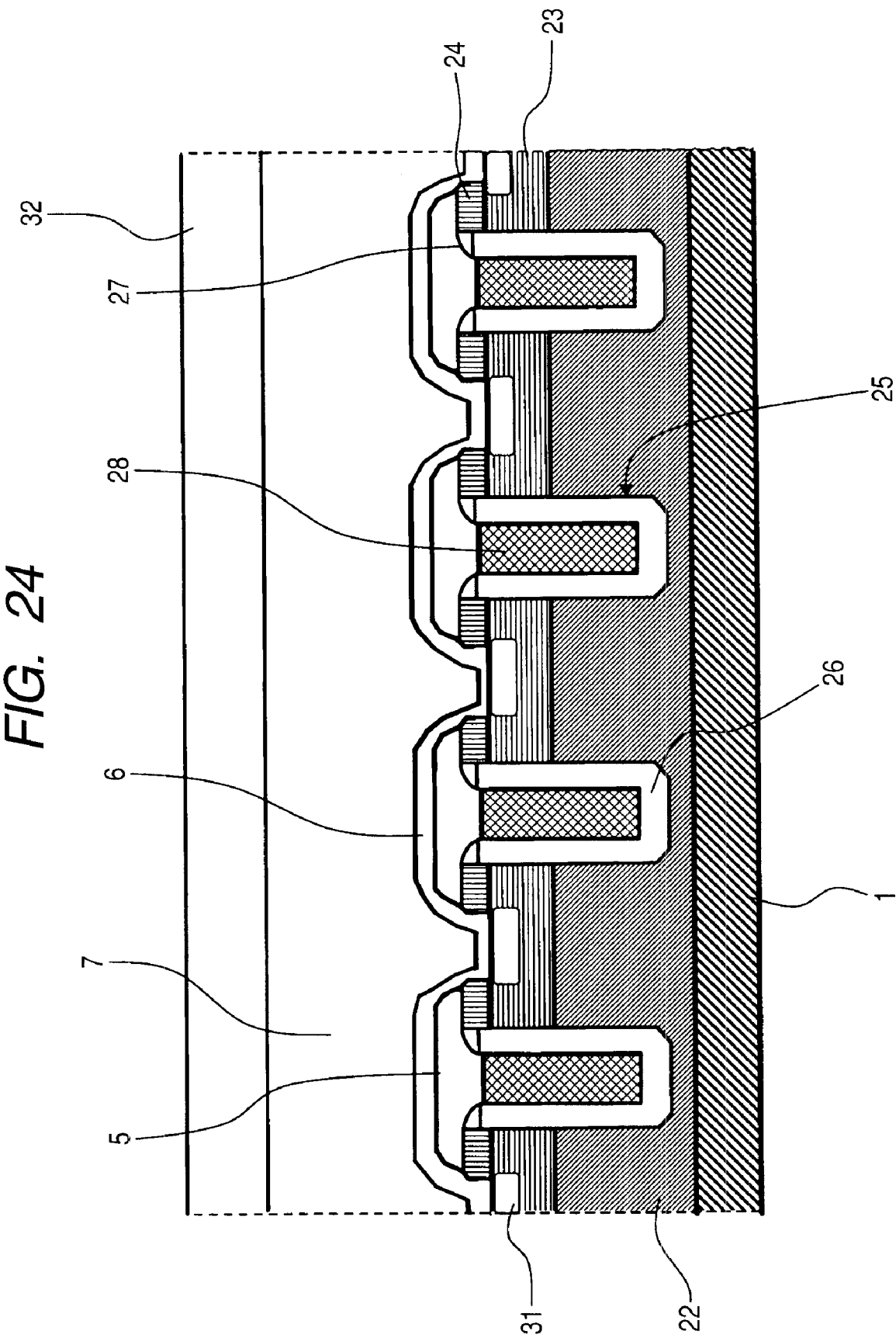
FIG. 24 is a device-cross-section view illustrating a main region in the process step (completion of the polyimide applying step) of the semiconductor-device-manufacturing method.

Next, as illustrated in FIG. 22, the resist film 43 is removed. Thereafter, as illustrated in FIG. 23, a polyimide film 32 as a final passivation is applied to be a thickness of about 2 μm (the thickness being varied from about 1.5 micrometers to 10 plus several micrometers as the case may be) onto the entire surface (polyimide-applying step 103 in FIG. 5). Subsequently, polyimide film openings for taking leads out to the external are made in regions of the polyimide film 32 where gate pads 13 and source pads 11 are required by ordinary lithography. FIG. 24 illustrates a situation of the device pattern region 12 at this time. In this figure, a region where the polyimide film openings are not made is illustrated.

4. Summary

The invention which has been made by the inventors has been specifically described by way of the embodiments. However, the invention is not limited thereto. The embodiments may be variously varied as far as the variations do not depart from the subject matter of the invention.

About the above-mentioned embodiments, description has been made giving, as examples, some of power semiconductor devices such as power MOSFETs, in particular, trench gate type power MOS devices. However, the invention is not limited thereto. The invention is widely applicable to physiographically structural devices having one-dimensional repeated high and low portions.

What is claimed is:

1. A method of manufacturing a semiconductor device, comprising the steps of:
   (a) forming a barrier metal film over a first main surface of a wafer having a band-form repeated device pattern region containing an insulated region and an electroconductive region;
   (b) forming an electrode metal film over the barrier metal film by sputtering, the electrode metal film comprising aluminum as a principal component and having a film thickness of 2.5 μm or more;
   (c) forming a resist film pattern over the electrode metal film; and
   (d) patterning the electrode metal film by wet etching in the state that the resist film pattern is present over the electrode metal film,
   wherein step (b) includes:
   (b1) forming a seed metal film over the barrier metal film by sputtering;
   (b2) forming a first electrode metal film over the seed metal film by sputtering at a first deposition rate, the first electrode metal film forming a portion of the electrode metal film;
   (b3) after substep (b2), forming a second electrode metal film over the first electrode metal film by sputtering at a second deposition rate, the second electrode metal film forming another portion of the electrode metal film,
   wherein the seed metal film, the first electrode metal film, and the second electrode metal film each comprise aluminum as a principal component, wherein a thickness of the second electrode metal film is greater than a thickness of the first electrode metal film, and wherein the second deposition rate in substep (b3) is less than the first deposition rate in substep (b2).

2. The method of manufacturing a semiconductor device according to claim 1, further comprising a step of:

(e) patterning the barrier metal film by dry etching in the state that the patterned electrode metal film is present over the barrier metal film.

3. The method of manufacturing a semiconductor device according to claim 1, wherein the device pattern region comprises:

(x) a plurality of band-form highland regions, each extending in a direction parallel to the first main surface of the wafer, the band-form highland regions being substantially parallel to each other in plan view; and (y) a plurality of band-form valley regions, each being arranged between adjacent ones of the band-form highland regions.

4. The method of manufacturing a semiconductor device according to claim 3, further comprising a step of:

(g) before the step (a), forming tapered portions at ends of each of the band-form highland regions, at least one of the ends facing one of the band-form valley regions.

5. The method of manufacturing a semiconductor device according to claim 4, wherein the formation of the tapered portions is attained by dry etching in the atmosphere of a gas comprising argon gas as a principal component.

6. The method of manufacturing a semiconductor device according to claim 1, wherein the sputtering in substep (b1) is performed at with the wafer at a temperature less than 400° C.;

wherein the sputtering in substep (b2) is performed with the wafer at a temperature of 400° C. or higher and lower than 500° C.; and wherein the sputtering in substep (b3) is performed with the wafer at a temperature of 400° C. or higher and lower than 500° C.

7. The method of manufacturing a semiconductor device according to claim 1, wherein the sputtering in substeps (b2) and (b3) is performed with the wafer over an electrostatic chuck, which is in an operating state.

8. The method of manufacturing a semiconductor device according to claim 7, wherein the sputtering of substep (b1) is performed with the wafer over the electrostatic chuck, which is in a non-operating state, or over a wafer susceptor, which is not an electrostatic chuck.

9. The method of manufacturing a semiconductor device according to claim 8, wherein substeps (b1), (b2), and (b3) are carried out in the same sputtering chamber.

10. The method of manufacturing a semiconductor device according to claim 1, wherein the substeps (b2) and (b3) are carried out in the same sputtering chamber.

11. The method of manufacturing a semiconductor device according to claim 1, wherein the steps (a) and (b) are carried out in the same machine.

12. The method of manufacturing a semiconductor device according to claim 1, wherein the wet etching in the step (d) is performed using an etchant comprising phosphoric acid and nitric acid as principal components.

13. The method of manufacturing a semiconductor device according to claim 1, wherein the semiconductor device is a power MOSFET device.

14. The method of manufacturing a semiconductor device according to claim 1, wherein the semiconductor device is a power MOSFET device of a trench gate type.

15. The method of manufacturing a semiconductor device according to claim 1, wherein the electrode metal film is an aluminum-based metal film comprising silicon in an amount of less than several percent and comprising aluminum as a principal component.

16. The method of manufacturing a semiconductor device according to claim 1, wherein the barrier metal film comprises titanium and tungsten as principal components.

17. The method of manufacturing a semiconductor device according to claim 1, wherein the sputtering in substeps (b1), (b2), and (b3) is performed using sputtering targets having substantially the same composition.

18. The method of manufacturing a semiconductor device according to claim 1, wherein a direct current power for the sputtering in substep (b2) is greater than a direct current power for the sputtering in substep (b3).

19. The method of manufacturing a semiconductor device according to claim 1, wherein the sputtering in substep (b1) is performed with the wafer at a lower temperature than a temperature of the wafer during the sputtering in substep (b2).

* * * * *